(12) United States Patent
Ohtani et al.

(10) Patent No.: US 9,954,094 B2
(45) Date of Patent: Apr. 24, 2018

(54) SEMICONDUCTOR DEVICE MANUFACTURING METHOD AND SEMICONDUCTOR DEVICE

(71) Applicant: Renesas Electronics Corporation, Tokyo (JP)

(72) Inventors: Kinya Ohtani, Tokyo (JP); Yasuhiro Nishimura, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/008,978

(22) Filed: Jan. 28, 2016

(65) Prior Publication Data

US 2016/0240654 A1 Aug. 18, 2016

(30) Foreign Application Priority Data

Feb. 16, 2015 (JP) ................................. 2015-027266

(51) Int. Cl.
| | | |
|---|---|---|
| *H01L 29/78* | (2006.01) |
| *H01L 29/66* | (2006.01) |
| *H01L 29/423* | (2006.01) |
| *H01L 21/265* | (2006.01) |
| *H01L 29/06* | (2006.01) |
| H01L 21/266 | (2006.01) |

(52) U.S. Cl.
CPC .... *H01L 29/7813* (2013.01); *H01L 21/26513* (2013.01); *H01L 29/0634* (2013.01); *H01L 29/4236* (2013.01); *H01L 29/66734* (2013.01); *H01L 29/7811* (2013.01); *H01L 21/266* (2013.01)

(58) Field of Classification Search
CPC ............ H01L 29/7813; H01L 29/0634; H01L 29/4236; H01L 29/66734; H01L 21/26513
See application file for complete search history.

(56) References Cited

U.S. PATENT DOCUMENTS

| | | | |
|---|---|---|---|
| 2011/0049614 A1 | 3/2011 | Gao et al. |
| 2011/0053326 A1 | 3/2011 | Gao et al. |
| 2012/0018800 A1* | 1/2012 | Kim ..................... H01L 29/0634 257/330 |
| 2012/0049270 A1* | 3/2012 | Hirler ................. H01L 29/6634 257/328 |
| 2012/0168856 A1* | 7/2012 | Luo ..................... H01L 29/0634 257/330 |

(Continued)

FOREIGN PATENT DOCUMENTS

| | | |
|---|---|---|
| JP | 2013-503491 A | 1/2013 |
| JP | 2013-503492 A | 1/2013 |

*Primary Examiner* — Nathan W Ha
(74) *Attorney, Agent, or Firm* — Sughrue Mion, PLLC

(57) ABSTRACT

In order to improve the performance of a semiconductor device, a p type impurity is ion implanted into an area of an n type semiconductor film that is epitaxially grown over a p type semiconductor substrate, and the p type impurity is not ion implanted into an area of the n type semiconductor film, which is adjacent to the area in which the p type impurity is ion implanted. In this way, a p⁻ type drift layer comprised of the area in which the p type impurity is introduced, as well as an n⁻ type semiconductor region comprised of the area in which the p type impurity is not introduced are formed.

4 Claims, 21 Drawing Sheets

(56) References Cited

U.S. PATENT DOCUMENTS

| | | | |
|---|---|---|---|
| 2013/0015493 A1* | 1/2013 | Senoo | H01L 29/7395 257/133 |
| 2014/0183560 A1* | 7/2014 | Lee | H01L 29/66068 257/77 |
| 2014/0231904 A1* | 8/2014 | Willmeroth | H01L 29/66734 257/330 |
| 2014/0246697 A1* | 9/2014 | Schulze | H01L 29/165 257/192 |
| 2015/0035048 A1* | 2/2015 | Weber | H01L 29/7811 257/329 |
| 2015/0035051 A1* | 2/2015 | Hebert | H01L 29/7813 257/334 |
| 2015/0076594 A1* | 3/2015 | Hsieh | H01L 29/0619 257/334 |

* cited by examiner

SEMICONDUCTOR DEVICE MANUFACTURING METHOD AND SEMICONDUCTOR DEVICE

CROSS-REFERENCE TO RELATED APPLICATIONS

The disclosure of Japanese Patent Application No. 2015-027266 filed on Feb. 16, 2015 including the specification, drawings and abstract is incorporated herein by reference in its entirety.

BACKGROUND

The present invention relates to a semiconductor device. In particular, the present invention is suitable for use, for example, in a semiconductor device including a metal insulator semiconductor field effect transistor (MISFET) of vertical type.

Power devices represented by a field effect transistor (FET) with high operating voltage that allows a large current to flow, or a so-called power transistor, are widely used in power supply for information equipment, home appliances, vehicle mounted equipment, and the like, as well as used in motor drive devices. The power transistors for such applications are required to reduce the ON resistance.

A trench gate type vertical MISFET is known as a power transistor. The trench gate type vertical MISFET is a device in which a metal insulator semiconductor (MIS) structure is formed in a groove, or a trench, formed in a semiconductor substrate in which current flows in the thickness direction of the semiconductor substrate. Further, there is a technique for reducing the ON resistance by using the trench gate type vertical MISFET having a super junction structure. The super junction structure is a structure formed in the drift layer of a vertical MISFET, in which a columnar semiconductor region having a polarity opposite to that of the drift layer is formed. Such a structure can contribute to an increase in the source-drain breakdown voltage. As a result, it is possible to improve the trade-off between the reduction in the ON resistance and the improvement of the source-drain breakdown voltage.

Japanese Unexamined Patent Application Publications (Translation of PCT Applications) No. 2013-503491 (Patent Document 1) and No. 2013-503492 (Patent Document 2) disclose a technique of having first and second columns of type 1 dopant as well as a column of type 2 dopant in a super-junction trench power metal oxide semiconductor field effect transistor device.

SUMMARY

For example, in an inverter included in an electronic system such as an electric vehicle system, an n-channel MISFET may be used as a low-side MISFET, similar to a high-side MISFET. In such a case, in order to turn a high-side n-channel MISFET to the ON state, it is necessary to apply a high potential as the gate potential of the high-side n-channel MISFET. For this reason, it is necessary to provide a charge pump in a control circuit of an inverter in order to increase the gate potential of the high-side n-channel MISFET to a level higher than the power supply potential. As a result, the control circuit of the inverter is complicated.

On the other hand, the charge pump may not be provided if a P-channel MISFET is used as a high-side MISFET. However, the ON resistance of the p-channel MISFET is higher than the ON resistance of the n-channel MISFET. Thus, in order to reduce the ON resistance as the p-channel MISFET, it is preferred to use a trench gate vertical MISFET having a super junction structure.

However, it is not easy to form a super junction structure in the p-channel trench gate vertical MISFET and not be able to reduce the ON resistance. As a result, the performance of the semiconductor including the p-channel MISFET is reduced. For this reason, it is difficult to use the p-channel MISFET as a high-side MISFET and to reduce the ON resistance while simplifying the control circuit of the inverter.

These and other objects and advantages will become apparent from the following description of the present specification and the accompanying drawings.

According to an embodiment of the present invention, there is provided a semiconductor device manufacturing method in which a p type impurity is ion implanted into a first area of an n type semiconductor film that is epitaxially grown over a p type semiconductor substrate, and the p type impurity is not ion implanted into a second area of the n type semiconductor film, the second area being adjacent to the first region. In this way, a p type first semiconductor region comprised of the first area in which the p type impurity is introduced, as well as a second semiconductor region comprised of the second region in which the p type impurity is not introduced are formed.

Further, according to another embodiment, a semiconductor device has a first semiconductor region and a second semiconductor region. The first semiconductor region is formed by implanting ions of a p type impurity into a first area of an n type semiconductor film that is epitaxially grown over a p type semiconductor substrate. The second semiconductor region is formed by not implanting ions of the p type impurity into a second area of the n type semiconductor film, the second area being adjacent to the first region. The first semiconductor region is comprised of the first area in which the p type impurity is introduced. The second semiconductor region is comprised of the second area in which the p type impurity is not introduced.

According to an embodiment of the present invention, it is possible to improve the performance of the semiconductor device.

DETAILED DESCRIPTION

Figure 1:
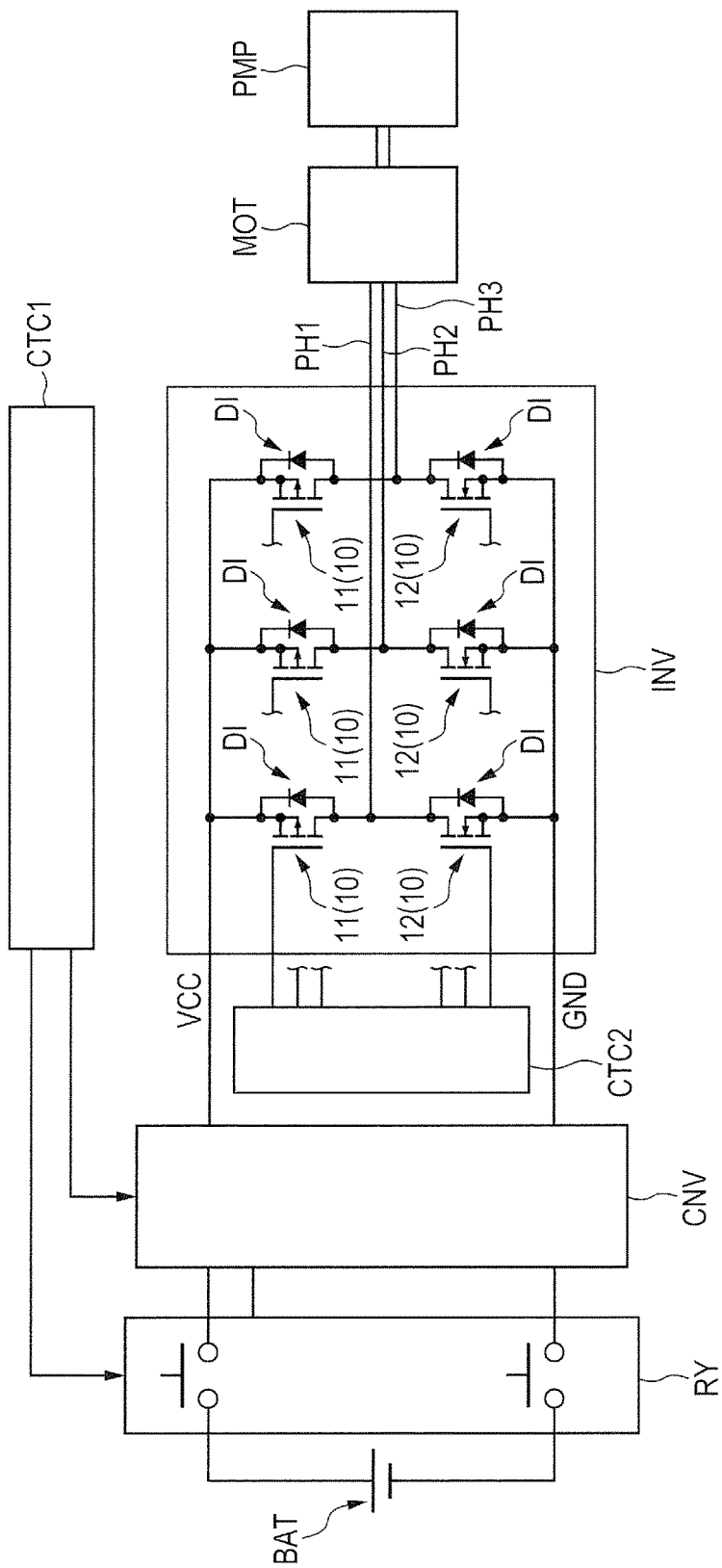
FIG. 1 is a circuit block diagram of an example of an electronic system in which a semiconductor device of an embodiment is used.

In the embodiment described below, the detailed description of the invention will be divided into a plurality of sections or embodiments when required as a matter of convenience. However, these sections or embodiments are not irrelevant to each other unless otherwise stated, and the one relates to the entire or a part of the other as a variation, details, or a supplementary explanation thereof.

Further, in the embodiment described below, when referring to the number of elements, and the like, (including number of pieces, numerical values, amount, range, and the like), the number of elements is not limited to a specific number unless otherwise stated or except the case where the number is apparently limited to a specific number in principle. The number larger or smaller than the specified number is also applicable.

Further, in the embodiment described below, it is needless to say that the components (including element steps and the like) are not always indispensable unless otherwise specifically stated or except the case where the components are apparently indispensable in principle. Also, in the embodiment described below, when referring to the shape, the positional relationship, or other characteristics of the components, those substantially closely related or similar to the shape or other characteristics are included unless otherwise stated or except the case where it is conceivable that they are apparently excluded in principle. The same goes for the numerical value and the range described above.

The details of a typical embodiment of the present invention will be described below with reference to the accompanying drawings. Note that in all the drawings for describing the embodiment, the same or similar parts are designated by the same reference numerals and the repetitive description thereof will be omitted.

Further, in some drawings used in the embodiment, hatching may be omitted even if it is a cross-sectional view to make the drawings easy to see. Meanwhile, hatching is used in some cases even in a plan view to make the drawings easy to see.

Further, in the embodiment described below, it is assumed, as an example, that a semiconductor device is comprised of a metal oxide semiconductor field effect transistor (MOSFET) of vertical type, which is one type of vertical MISFET. However, the semiconductor device can also be comprised of various types of vertical MISFET other than the vertical MOSFET.

Embodiment

Hereinafter, a semiconductor device according to an embodiment will be described with reference to the accompanying drawings.

In the present embodiment, a semiconductor device is comprised of a p-channel trench gate vertical MOSFET having a super junction structure, and is used in electronic systems such as electric vehicle systems. Thus, first of all, an electronic system in which the semiconductor device of the present embodiment is used will be described. A description will also be given of the reason why the use of the p-channel trench gate vertical MOSFET having the super junction structure is preferred in such electronic systems.

<Description of the Electronics System in which the Semiconductor Service is Used>

Figure 2:
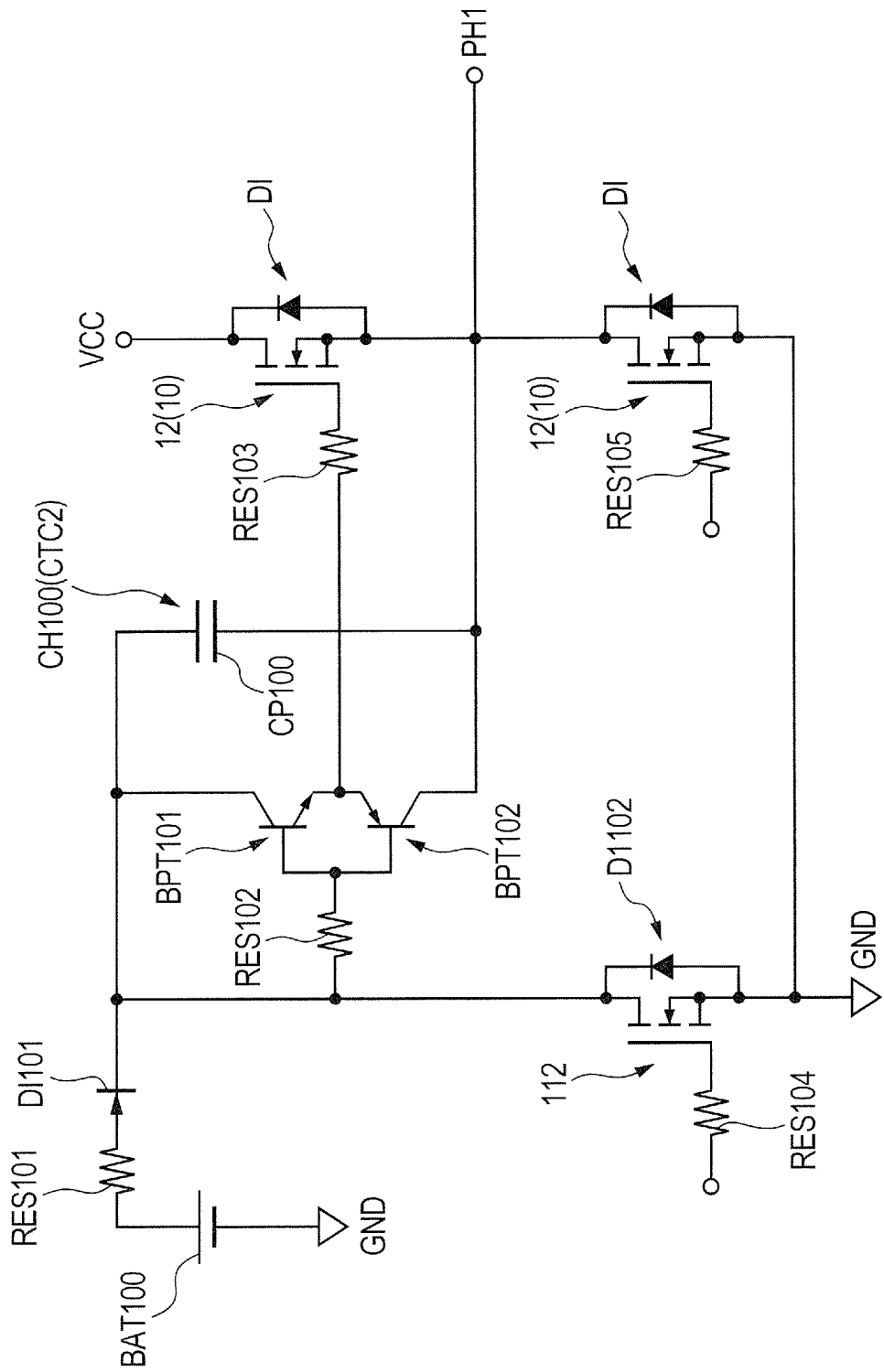
FIG. 2 is a circuit diagram of an electronic system of a first comparative example.

FIG. 1 is a circuit block diagram of an example of an electronic system in which the semiconductor device of the present embodiment is used. FIG. 2 is a circuit diagram of an electronic system of a first comparative example.

Figure 3:
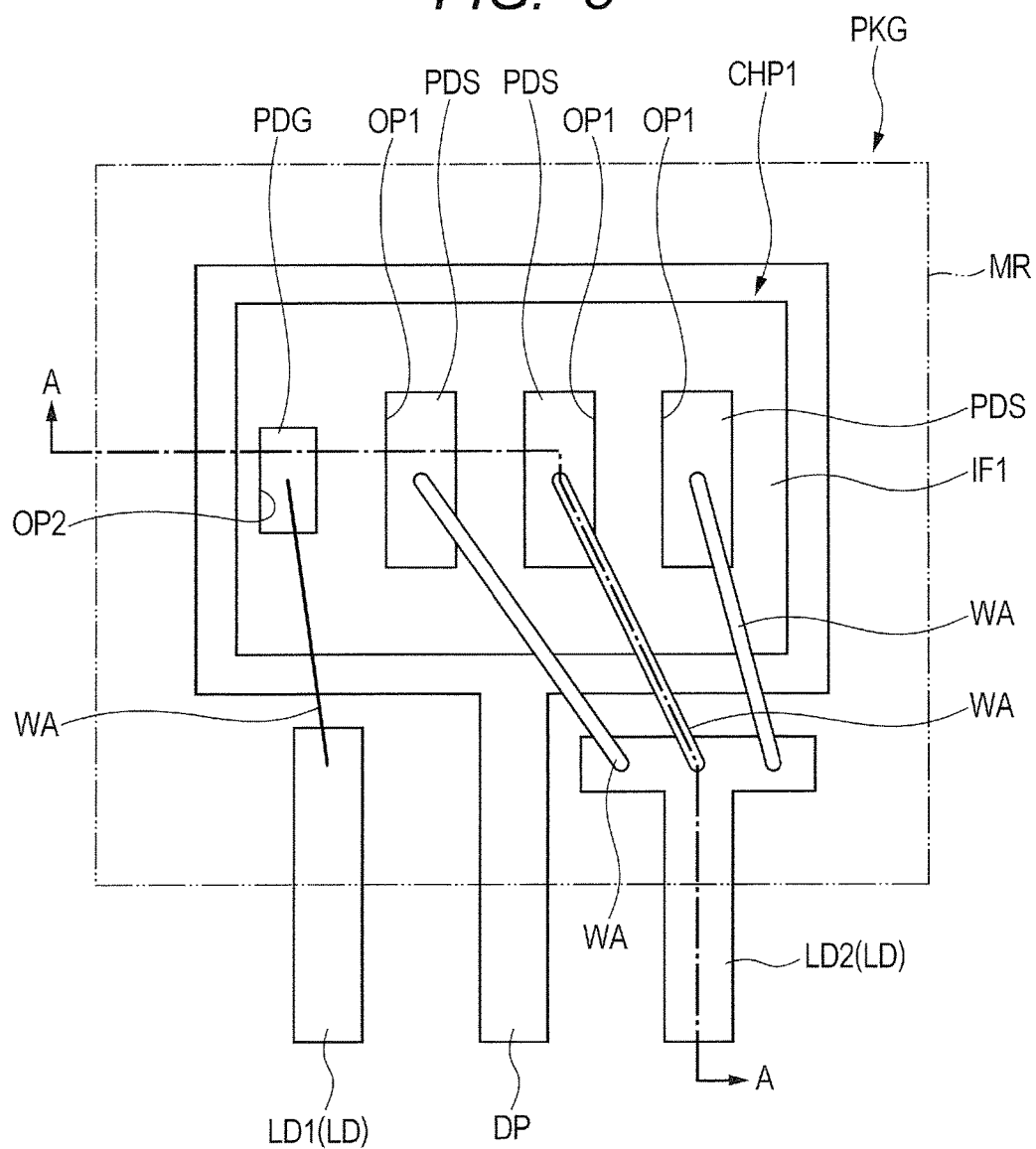
FIG. 3 is a top view schematically showing an example of a semiconductor package according to the embodiment.
Figure 4:
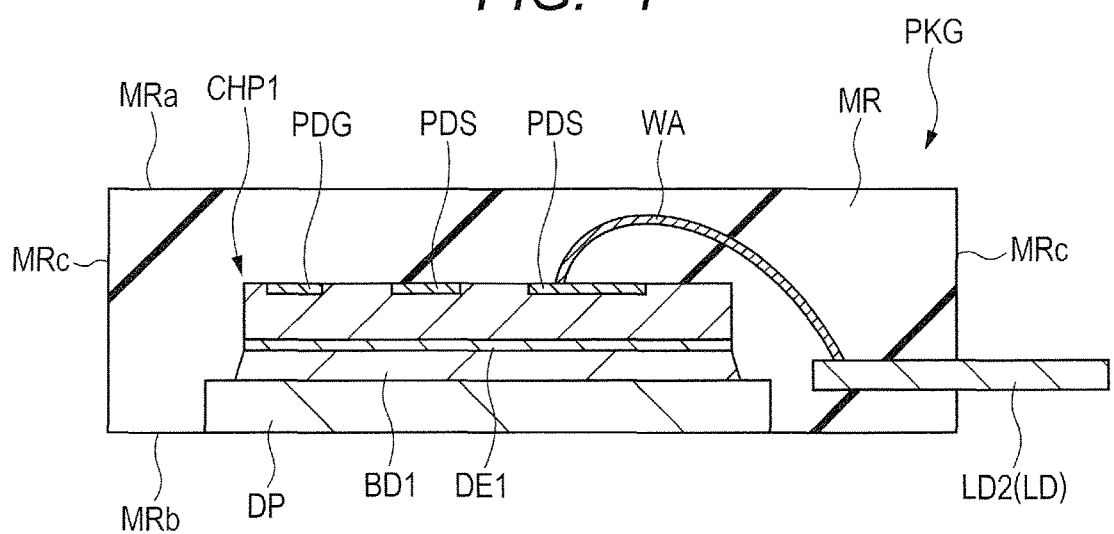
FIG. 4 is a cross-sectional view schematically showing an example of the semiconductor package according to the embodiment.

As shown in FIG. 1, an electric vehicle system as an electronic system in which the semiconductor device of the present embodiment is used, includes a load such as motor MOT, an inverter INV, a power supply BAT, a control circuit CTC1, and a control circuit CTC2. Here, a three-phase motor is used as the motor MOT. The three-phase motor is configured so that it is driven by a three-phase voltage with different phases. A semiconductor chip CHP1 as a semiconductor device, which will be described below with reference to FIGS. 5 to 8, or a semiconductor package PKG as a semiconductor device, which will be described below with reference to FIGS. 3 and 4, is a component of the inverter INV.

In the electric vehicle system shown in FIG. 1, the power supply BAT is coupled to the inverter INV through a relay RY and a converter CNV. Thus, the DC voltage of the power supply BAT, namely, the DC power is supplied to the inverter INV. Because the converter CNV is interposed between the power supply BAT and the inverter INV, the DC voltage of the power supply BAT is raised or converted to a DC voltage suitable for motor drive, by the converter CNV. Then, the DC voltage is supplied to the inverter INV. The relay RY is interposed between the power supply BAT and the converter CNV to switch between connection and disconnection between the power supply BAT and the converter CNV.

The control circuit CTC1 includes, for example, an electronic control unit (ECU), in which a control semiconductor chip such as micro controller unit (MCU) is mounted. The relay RY and the converter CNV can be controlled by the control circuit CTC1.

The motor MOT is coupled to the inverter INV. The DC voltage supplied from the power supply BAT to the inverter INV through the converter CNV, or the DC power is converted into an AC voltage, or AC power by the inverter INV. Then, the AC voltage is supplied to the motor MOT. The motor MOT is driven by the AC voltage, or the AC power supplied from the inverter INV.

In the electric vehicle system shown in FIG. 1, the motor MOT can drive the pump PMP to supply engine oil or fuel, or to circulate the refrigerant.

The control circuit CTC2 is coupled to the inverter INV, so that the inverter INV is controlled by the control circuit CTC2. In other words, the DC voltage, namely, the DC power is supplied from the power supply BAT to the inverter INV. The DC voltage is converted into an AC voltage, or AC power by the inverter INV controlled by the control circuit CTC2. Then, the AC voltage is supplied to the motor MOT to drive the motor MOT.

Similar to the control circuit CTC1, the control circuit CTC2 also includes, for example, ECU in which the control semiconductor chip such as MCU is mounted. For convenience of the description, there is shown an example in which the control circuit CTC2 is separately provided from the control circuit CTC1. However, the control circuit CTC2 may be formed integrally with the control circuit CTC1.

In the example shown in FIG. 1, the motor MOT is a three-phase motor having U phase PH1, V phase PH2, and W phase PH3. Thus, the inverter INV also corresponds to the three phases of the U phase PH1, V phase PH2, and W phase PH3. Such an inverter INV, corresponding to the three phases, has six MOSFETs 10 and six diodes DI.

Note that when the motor MOT is a two-phase motor, the inverter INV has four MOSFETs 10 and four diodes DI.

Of the inverter INV, the one that is more on the power supply potential VCC side than the input potential of the motor MOT is referred to as the high side. Further, of the inverter INV, the one that is more on the ground potential GND side than the input potential of the motor MOT is referred to as the low side. In the example shown in FIG. 1, three p-channel MOSFETs 11 are used as high-side MOSFETs 10, and three n-channel MOSFETs 12 are used as low-side MOSFETs. Then, in the present embodiment, the MOSFET 11 (see FIG. 5 descried below) included in the semiconductor chip CHP1 (see FIG. 5 described below) is used as the high-side p-channel MOSFET 11.

In the example shown in FIG. 1, in each of the three phases of U phase PH1, V phase PH2, and W phase PH3, the p-channel MOSFET 11 and the diode DI are coupled back-to-back between the power supply potential, which is supplied from the power supply BAT to the inverter INV through the converter CNV, and the input potential of the motor MOT, namely, on the high side. Further, in each of the three phases of U phase PH1, V phase PH2, and W phase PH3, the n-channel type MOSFET 12 and the diode DI are coupled back-to-back between the input potential of the motor MOT and the ground potential GND, namely, on the low side. Then, the control circuit CTC2 is coupled to the gate electrode of each of the six MOSFETs 10 including three p-channel MOSFETs 11 and three n-channel type MOSFETs 12. In this way, each of the six MOSFETs 10 is controlled by the control circuit CTC2.

The motor is driven and rotated by controlling the current flowing through each MOSFET 10 by using the control circuit CTC2. In other words, it is possible to drive the motor MOT by controlling ON/OFF of each of the MOSFETs 10 by the control circuit CTC2. As described above, it is necessary to turn ON/OFF the MOSFET 10 to drive the motor MOT. However, an inductance is included in the motor MOT. Thus, when the MOSFET 10 is turned off, a reverse current occurs in the opposite direction to the direction in which the current of the MOSFET 10 flows due to the inductance included in the motor MOT. The MOSFET 10 does not have a function to allow the reverse current to flow. Thus, the diode DI is provided back-to-back with the MOSFET 10 to allow the reverse current to flow backward in order to release the energy accumulated in the inductance.

Here, as shown in the first comparative example in FIG. 2, the case in which the n channel MOSFET 12 is used as the high side MOSFET 10 is considered similarly to the case of the low side MOSFET 10. In such a case, in order to switch the high-side n-channel type MOSFET 12 to the on state, it is necessary to apply a higher potential than the drain potential, namely, the power supply potential VCC as the gate potential of the high-side n-channel MOSFET 12. Thus, it is necessary to provide a charge pump CH100 within the control circuit CTC2 to increase the gate potential of the high-side n-channel MOSFET to a level higher than the power supply potential. Thus, the control circuit CTC2 is complicated.

In the first comparative example shown in FIG. 2, the charge pump CH100 includes a power supply BAT100 as a DC power supply, resistances RES101 to RES104, diodes DI101 and DI102, bipolar transistors BPT101 and BPT102, a capacitor CP100, and a MOSFET 112. As a result, the control circuit CTC2 is complicated. Note that in FIG. 2, a resistance RES105 is coupled to the gate of the low-side n-channel MOSFET12.

Further, when the charge pump CH100 is provided, an oscillation or noise signal may occur caused by the charge pump CH100.

Note that, for easy understanding, FIG. 2 only shows a circuit diagram of the U phase PH1 of the three phases of U phase PH1, V phase PH2, and W phase PH3.

On the other hand, when the p-channel MOSFET 11 is used as the high-side MOSFET 10, there is no need to provide the charge pump CH100 as that shown in FIG. 2 and the control circuit CTC2 can be simplified. As a result, it is possible to prevent or reduce the occurrence of an oscillation or noise signal caused by the charge pump CH100.

However, the ON resistance of the p-channel MOSFET 11 is higher than that of the n-channel MOSFET 12. On the other hand, by using the trench gate type vertical MOSFET having the super junction structure as the p-channel MOSFET 11, it is possible to reduce the ON resistance while keeping the source-drain breakdown voltage constant. Thus, by using the p-channel MOSFET 11 having the super junction structure of the present embodiment as the MOSFET 11 on the high side of the inverter INV, it is possible to simplify the control circuit CTC2 of the inverter INV, and to reduce the ON resistance of the p-channel MOSFET 11.

Thus, for example, when the motor MOT for driving the pump PMP is driven in the electric vehicle system, it is preferred to use the MOSFET 11 which is the trench gate type vertical MOSFET having the super junction structure.

<Description of the Semiconductor Package Configuration>

The next describes the configuration of a semiconductor package in which a semiconductor chip as a semiconductor device of the present embodiment is packaged.

FIG. 3 is a top view schematically showing an example of the semiconductor package in the embodiment. FIG. 4 is a cross-sectional view schematically showing an example of the semiconductor package in the embodiment. FIG. 4 is a cross-sectional view taken along line A-A of FIG. 3.

As shown in FIGS. 3 and 4, the semiconductor package PKG as the semiconductor device includes a semiconductor chip CHP1, a die pad DP on which the semiconductor chip CHP1 is mounted, a lead LD comprised of a conductor, a conductive wire WA as a bonding wire, and a sealing resin MR to seal these components.

The sealing resin MR has an upper surface MRa, a lower surface MRb, and side surfaces MRc. The sealing resin MR is comprised of a resin material, such as, for example, a thermosetting resin, and can also include a filler. For example, the sealing resin MR can be formed by using epoxy resin including a filler, or the like. It is also possible to use, in addition to the epoxy-based resin, for example, a biphenyl-based thermosetting resin in which a phenolic curing agent, silicon rubber, filler, or other materials are added, as the material of the sealing resin MR for reasons such as stress reduction requirements.

The lead LD is comprised of a conductor, and preferably, of a metal material such as copper (Cu) or copper alloy. The semiconductor package PKG has at least one lead LD. In the case of FIGS. 3 and 4, the semiconductor package PKG has two leads LD, namely, leads LD1 and LD2.

A part of each lead LD is sealed within the sealing resin MR. The other part of the lead LD projects from the side surface MRc of the sealing resin MR to the outside of the sealing resin MR, and is exposed from the sealing resin MR. The part of the lead LD1 that is exposed from the sealing resin MR functions as an external terminal that is electrically coupled to a gate pad PDG of the semiconductor chip CHP1. Further, the part of the lead LD2 exposed from the sealing resin MR functions as an external terminal that is electrically coupled to a source pad PDS of the semiconductor chip CHP1.

Note that the present invention is not limited to the structure in which a part of each lead LD projects from the side surface MRc of the sealing resin MR. It is also possible a structure, such as, for example, Quad Flat Package (QFN) type structure in which each lead LD barely projects from the side surface MRc of the sealing resin MR and a part of each lead LD is exposed in the lower surface MRb of the sealing resin MR.

Also, the present invention is not limited to the structure, as shown in FIGS. 3 and 4, in which the exposed part of each lead LD is flat. For example, it is also possible that the lower surface adjacent to the edge of the exposure part of each lead LD is folded to be positioned on substantially the same plane as the lower surface MRb of the sealing resin MR.

The lower surface of the die pad DP is exposed in the lower surface MRb of the sealing resin MR. The die pad DP is not exposed in the upper surface MRa of the sealing resin MR. The die pad DP is a chip mounting part in which the semiconductor chip CHP1 is mounted. Further, a part of the die pad DP projects from the side surface MRc of the sealing resin MR to the outside of the sealing resin MR, and is exposed from the sealing resin MR. The part of the die pad DP exposed from the sealing resin MR functions as an external terminal that is electrically coupled to a drain electrode DE1 of the semiconductor chip CHP1.

The die pad DP is comprised of a conductor, and preferably comprised of a metal material such as copper (Cu) or copper alloy. It is more preferred that the die pad DP and the lead LD1 are formed of the same material, namely, the same metal material. This makes it easy to form the semiconductor package PKG.

The semiconductor chip CHP1 is mounted over the upper surface of the die pad DP. Here, of the two main surfaces located opposite to each other in the semiconductor chip CHP1, the main surface on the side in which the source pad PDS and the gate pad PDG are formed is referred to as the surface of the semiconductor chip CHP1. Further, the main surface, which is opposite the surface of the semiconductor chip CHP1 and is on the side in which the drain electrode DE1 is formed, is referred to as the back surface of the semiconductor chip CHP1. At this time, the source pad PDS and the gate pad PDG are formed over the surface of the semiconductor chip CHP1, and the drain electrode DE1 as a back electrode is formed in the back surface of the semiconductor chip CHP1.

The semiconductor chip CHP1 is mounted over the upper surface of the die pad DP in such a way that the surface of the semiconductor chip CHP1 is directed upward, and that the back surface of the semiconductor chip CHP1 is directed to the upper surface of the die pad DP. In other words, the semiconductor chip CHP1 is mounted over the upper surface of the die pad DP in such a way that the drain electrode DE1 of the semiconductor chip CHP1 is directed to the die pad DP. The back surface of the semiconductor chip CHP1 is bonded and fixed to the upper surface of the die pad DP through a conductive bonding layer BD1. In this way, the drain electrode DE1 of the semiconductor chip CHP1 is bonded and fixed to the die pad DP through the conductive bonding layer BD1, and at the same time, are electrically coupled thereto. The bonding layer BD1 has conductivity and is comprised of a conductive past-type bonding material, such as, for example, silver (Ag) past, or comprised of solder. The semiconductor chip CHP1 is sealed within the sealing resin MR and is not exposed from the sealing resin MR.

The heat generated during the operation of the semiconductor chip CHP1 can be released to the outside, mainly from the back surface of the semiconductor chip CHP1 through the die pad DP. Thus, the die pad DP is preferably made greater than the area of the semiconductor chip CHP1 mounted thereon. In this way, it is possible to improve the radiation performance.

The gate pad PDG of the semiconductor chip CHP1 is electrically coupled to the lead LD1 through a wire WA which is a conductive coupling member. Further, the source pad PDS of the semiconductor chip CHP1 is electrically coupled to the lead LD2 through the wire WA.

More specifically, one end portion of the wire WA is coupled to the part of the lead LD1 sealed within the sealing resin MR, and the other end portion of the wire WA is coupled to the gate pad PDG. Then, the lead LD1 and the gate pad PDG of the semiconductor chip CHP1 are electrically coupled through the wire WA. Further, one end portion of the other wire WA is coupled to the part of the lead LD2 sealed within the sealing resin MR, and the other end portion of the wire WA is coupled to the source pad PDS. Then, the lead LD2 and the source pad PDS of the semiconductor chip CHP1 are electrically coupled through the wire WA.

The wire WA is preferably comprised of a metal line such as a gold (Au) line, a copper (Cu) line, or an aluminum (Al) line. The wire WA is sealed within the sealing resin MR and is not exposed from the sealing resin MR.

<Semiconductor Device>

Next, the semiconductor device of the present embodiment will be described. As described above, the semiconductor device of the present embodiment includes a p-channel trench gate vertical MOSFET having the super junction structure.

Figure 5:
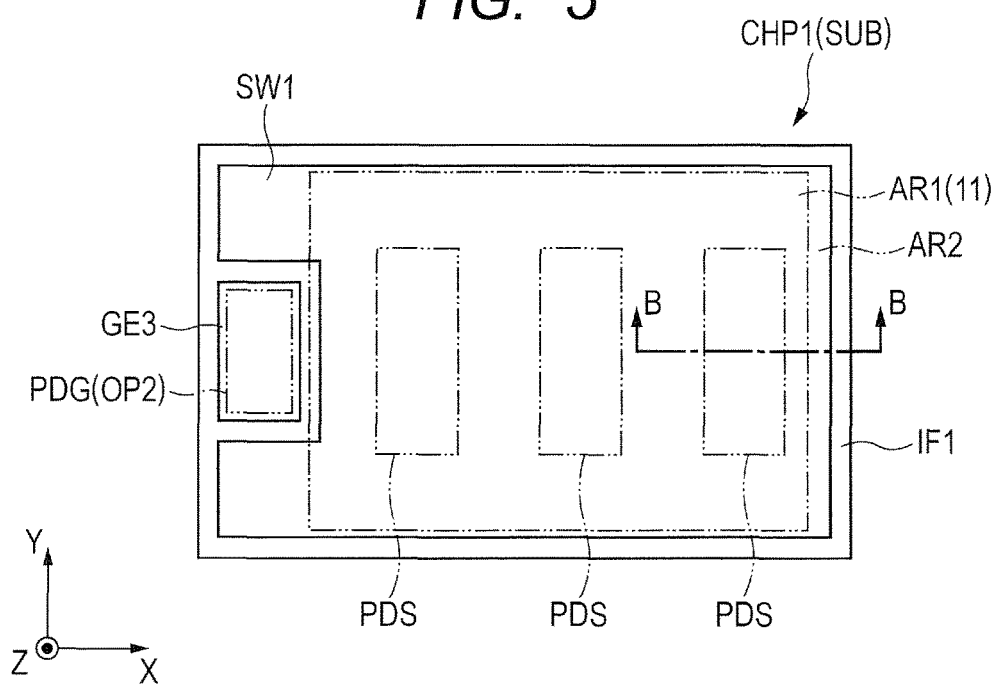
FIG. 5 is a plan view of a semiconductor chip in which the semiconductor device of the embodiment is formed.
Figure 6:
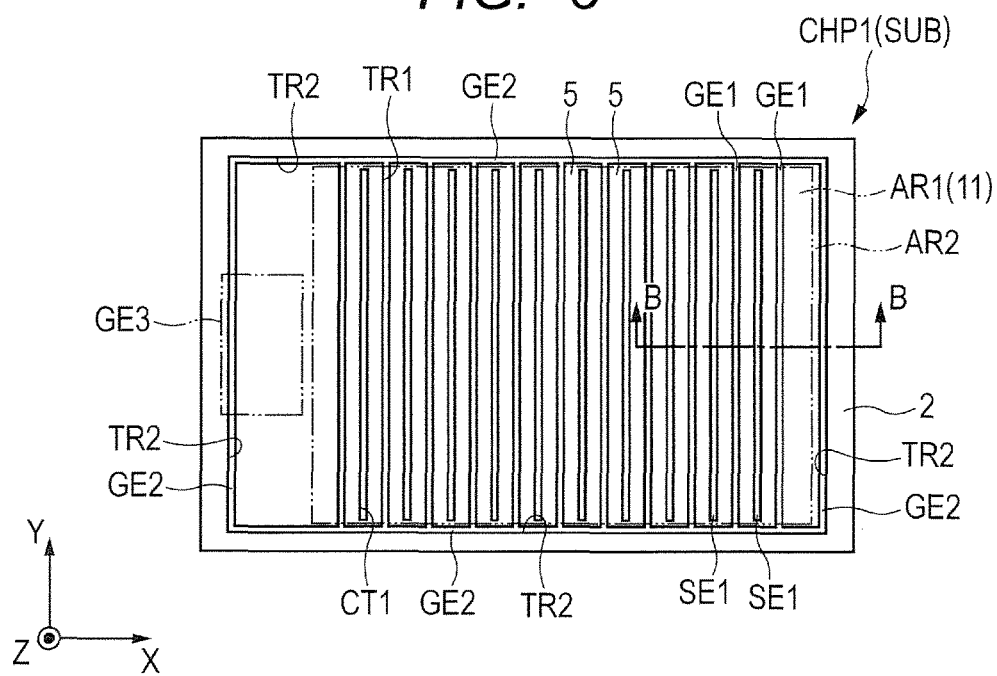
FIG. 6 a plan view of the semiconductor chip in which the semiconductor device of the embodiment is formed.
Figure 7:
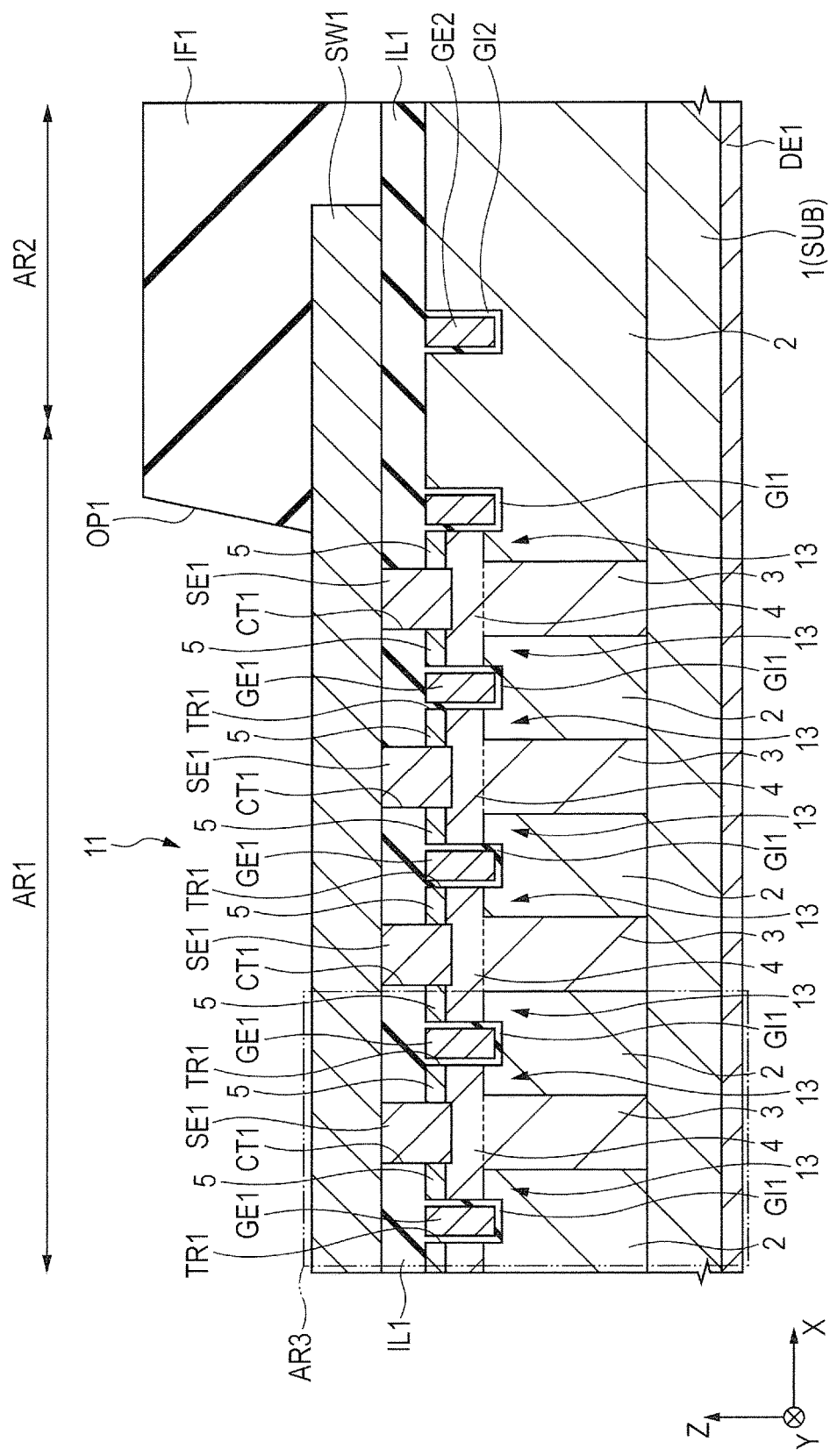
FIG. 7 is an essential-part cross-sectional view of the semiconductor device according to the embodiment.
Figure 8:
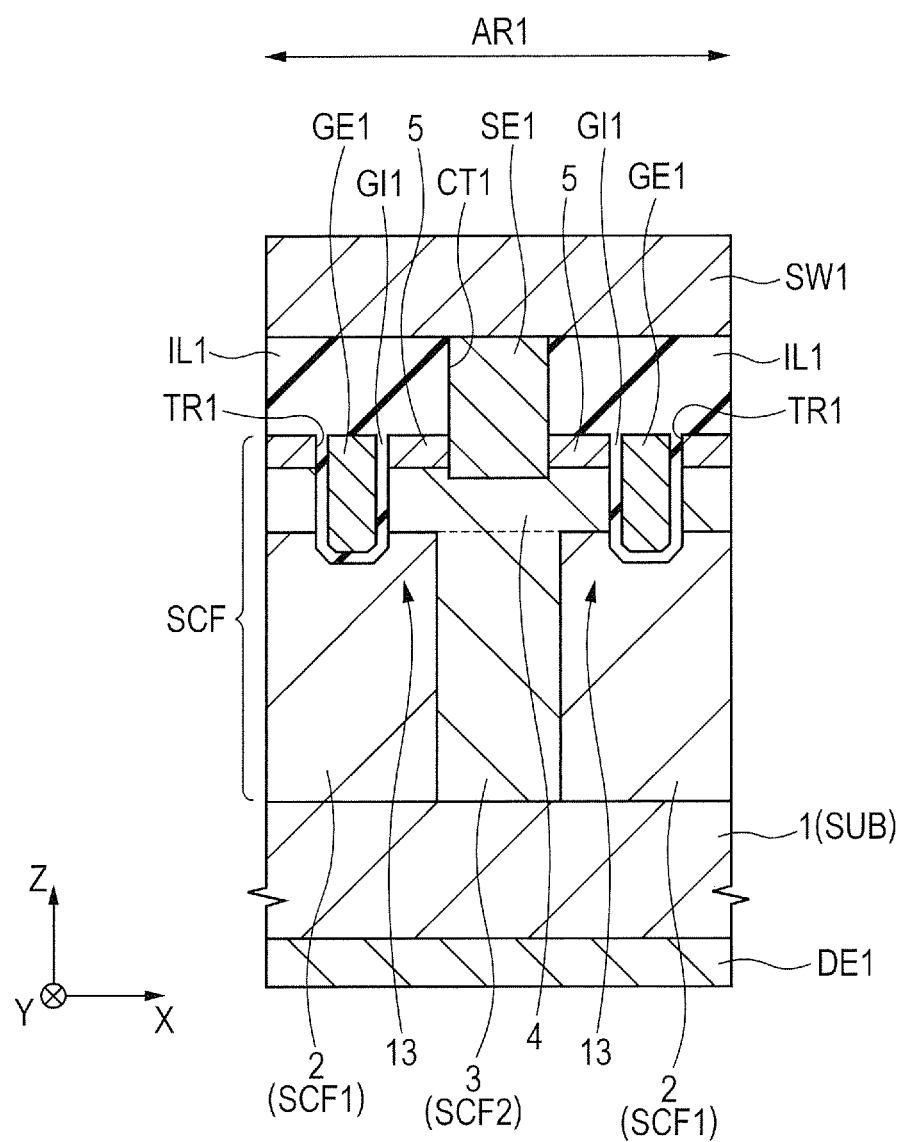
FIG. 8 is an essential-part cross-sectional view of the semiconductor device according to the embodiment.

FIGS. 5 and 6 are plan views of the semiconductor chip in which the semiconductor device of the embodiment is formed. FIGS. 7 and 8 are essential-part cross-sectional views of the semiconductor device of the embodiment. FIG. 7 is a cross-sectional view taken along line B-B of FIGS. 5 and 6. FIG. 8 is an enlarged view of the area AR3 surrounded by the dashed double-dotted lines in FIG. 7.

Note that FIG. 5 shows a perspective view with an insulating film IF1 (see FIG. 7) removed for easy understanding of the description, in which the outer periphery of the source pad PDs and the gate pad PDG are shown by the dashed double-dotted lines. Further, FIG. 6 shows a perspective view with an interlayer insulating film IL1 and the insulating film IF1 (see FIGS. 7 and 8) removed for easy understanding of the description, in which the outer periphery of a cell area AR1 and an outer gate electrode GE3 are shown by the dashed double-dotted lines.

As shown in FIGS. 5 to 8, the semiconductor device of the present embodiment has a semiconductor substrate SUB. The semiconductor substrate SUB has an upper surface as a main surface, as well as a lower surface as another surface opposite the upper surface. Further, the semiconductor substrate SUB has the cell area AR1 as a part of the area of the upper surface, as well as a gate wiring lead area AR2 as another part of the area of the upper surface.

The semiconductor substrate SUB is comprised of a $p^+$ type drain layer 1. The $p^+$ type drain layer 1 is comprised of a silicon (Si) in which a p type impurity, such as, for example, boric acid is diffused, and is comprised of a semiconductor whose conductivity type is p type. In other words, the semiconductor substrate SUB is a p type semiconductor substrate. The concentration of the p type impurity in the $p^+$ type drain layer 1 is higher than the concentration of the p type impurity in a $p^-$ type drain layer 1 described below. Further, various p type semiconductors, other than silicon, can also be used as the $p^+$ type drain layer 1.

Note that in the present specification, the phrase "the conductive type of the semiconductor is p type" means that the hole concentration is higher than the electron concentration and the hole is a main charge carrier, although it is possible that only holes are charge carriers or both electrons and holes are charge carriers.

As shown in FIGS. 5 to 8, the p-channel MOSFET 11 is formed in the cell area AR1. The p-channel MOSFET 11 is comprised of the MOSFETs 13 coupled in parallel to each other. Each MOSFET 13 is a p-channel trench gate vertical MOSFET. In other words, the cell area AR1 is the area in which the MOSFETs 13, each of which is a p-channel trench gate vertical MOSFET. The configuration of the semiconductor device in the cell area AR1 will be described below.

A source wiring SW1 is formed in the cell area AR1. The source pad PDS is the part of the source wiring SW1 exposed in an opening OP1 that is formed in the insulating film IF1 formed over the source wiring SW1. As shown in FIG. 7, the source wiring SW1 is electrically coupled to a p+ type source layer 5 through a source electrode SE1. For example, the source electrode SE1 and the source wiring SW1 are comprised of aluminum (Al).

As shown in FIGS. 5 and 6, an outer gate trench TR2, as well as outer gate electrodes GE2 and GE3 are formed in the gate wiring lead area AR2.

The outer gate electrode GE2 is formed to fill the outer gate trench TR2 through an outer gate insulating film G12 (see FIG. 7). The outer gate electrode GE2 is electrically coupled to the gate electrode GE1 of the MOSFET 13, which is formed to fill the gate trench TR1. The outer gate electrode GE2 is comprised of a polysilicon film or other thin film materials, in which an n type impurity, such as, for example, phosphorus (P) or arsenic (As) is diffused at a high concentration, similarly to the gate electrode GE1.

The outer gate electrode GE3 is electrically coupled to the outer gate electrode GE2. The gate pad PDG is the part of the outer gate electrode GE3 exposed in an opening OP2 (see FIG. 5) that is formed in the insulating film IF1 formed over the outer gate electrode GE3. For example, the outer gate electrode GE3 is comprised of aluminum (Al).

<Configuration of the Semiconductor Device in the Cell Area>

Hereinafter, the configuration of the semiconductor device in the cell area AR1 according to the present embodiment will be described.

As shown in FIGS. 7 and 8, the semiconductor device of the present embodiment includes, in the cell area AR1, a $p^-$ type drift layer 2, an $n^-$ type semiconductor region 3, an n type body layer 4, a $p^+$ type source layer 5, a gate trench TR1, a gate insulating film GI1, and a gate electrode GE1. The $p^-$ type drift layer 2 is a p type semiconductor region, the n type body layer 4 is an n type semiconductor region, and the $p^+$ type source layer 5 is a p type semiconductor region.

Note that in the present specification, the phrase "the conductivity type of the semiconductor is n type" means that the electron concentration in the semiconductor is higher than the hole concentration and that electrons are the main charge carriers, although it is possible that only electrons are charge carriers or both electrons and holes are charge carriers.

Further, the semiconductor device according to the present embodiment includes an interlayer insulating film IL1, a contact groove CT1, a source electrode SE1, a source wiring SW1, and a drain electrode DE1.

The MOSFET 13, which is a p-channel trench gate vertical MOSFET, is formed by the $p^-$ type drift layer 2, the n type body layer 4, the $p^+$ type source layer 5, the gate insulating film. GI1, and the gate electrode GE1.

The $p^-$ type drift layer 2 is formed over the $p^+$ type drain layer 1 in the cell area AR1. In other words, the $p^-$ type drift layer 2 is formed over the semiconductor substrate SUB comprised of the $p^+$ type drain layer 1, in the cell area AR1. The $p^-$ type drift layer 2 is a p type semiconductor layer comprised of silicon (Si) in which a p type impurity, such as, for example, boron (B) is diffused. The p type impurity concentration in the $p^-$ type drift layer 2 is smaller than the p type impurity concentration in the $p^+$ type drain layer 1.

Note that various p type semiconductors other than silicon can be used as the $p^-$ type drift layer 2.

The $n^-$ type semiconductor region 3 is formed adjacent to the $p^-$ type drift layer 2 over the $p^+$ type drain layer 1 in the cell area AR1. In other words, the $n^-$ type semiconductor region 3 is formed adjacent to the $p^-$ type drift layer 2, over the semiconductor substrate SUB comprised of the $p^+$ type drain layer 1 in the cell area AR1. The $n^-$ type semiconductor region 3 is comprised of silicon (Si) in which an n type impurity, such as, for example, phosphorus (P) or arsenic (As) is diffused. The $n^-$ type semiconductor region 3 is a semiconductor layer whose conductivity type is n type, which is different from p type. Note that various n type semiconductors other than silicon can be used as the $n^-$ type semiconductor region 3.

The $p^-$ type drift layer 2 and the $n^-$ type semiconductor region 3 are formed in such a way that the p type impurity is ion implanted into an area SCF1 of an n type semiconductor film SCF that is epitaxially grown over the semiconductor substrate SUB, and that the p type impurity is not ion implanted into an area SCF2 of the semiconductor film SCF, which is adjacent to the area SCF1. The n type impurity is introduced into the n type semiconductor film SCF. The $p^-$ type drift layer 2 is comprised of the area SCF1 in which the p type impurity is introduced. The $n^-$ type semiconductor region 3 is comprised of the area SCF2 in which the n type impurity is introduced and the p type impurity is not introduced.

In this way, it is possible to easily form the super junction structure including the interface between the $p^-$ type drift layer 2 and the $n^-$ type semiconductor region 3 so as to reach the lower surface from the upper surface of the semiconductor film SCF. In other words, the $p^-$ type drift layer 2 is brought into contact with the $p^+$ type drain layer 1, and the lower surface of the $n^-$ type semiconductor region 3 is located at the same height as the upper surface of the $p^+$ type drain layer 1. Then, the $n^-$ type semiconductor region 3 is brought into contact with the $p^+$ type drain layer 1.

The N type body layer 4 is formed over the $p^-$ type drift layer 2 and over the $n^-$ type semiconductor region 3 in the cell area AR1. The n type body layer 4 is comprised of silicon (Si) in which an n type impurity, such as, for example, phosphorus (P) or arsenic (As) is diffused. In other words, the n type impurity is introduced into the n type body layer 4. Note that various n type semiconductors other than silicon can be used as the n type body layer 4.

Preferably, the n type impurity concentration in the n type body layer 4 is greater than the n type impurity concentration in the $n^-$ type semiconductor region 3. In this way, when the n type impurity concentration in the n type body layer 4 is lower than the n type impurity concentration in the $n^-$ type semiconductor region 3, it is possible to reduce the n type impurity concentration in the $n^-$ type semiconductor region 3, and to increase the breakdown voltage of the MOSFET 13. Further, when the n type impurity concentration in the n type body layer 4 is lower than the n type impurity concentration in the $n^-$ type semiconductor region 3, it is possible to increase the n type impurity concentration in the n type body layer 4. Thus, it is possible to adjust a wide range of threshold voltage of the MOSFET 13.

The $p^+$ type source layer 5 is formed over the n type body layer 4 in the cell area AR1. In other words, the $p^+$ type source layer 5 is formed over the $p^-$ type drift layer 2 and over the $n^-$ type semiconductor region 3, through the n type body layer 4. The $p^+$ type source layer 5 is a p type semiconductor region comprised of silicon (Si) in which a p type impurity, such as, for example, boron (B) is diffused.

The p type impurity concentration in the $p^+$ type source layer 5 is higher than the p type impurity concentration in the $p^-$ type drift layer 2. Note that various p type semiconductors other than silicon can be used as the $p^+$ type source layer 5.

A plurality of gate trenches TR1, as grooves, are formed in the $p^+$ type source layer 5, the n type body layer 4, and the $p^-$ type drift layer 2 in the cell area AR1. Each of the gate trenches TR1 passes through the part of the $p^+$ type source layer 5 that is located above the $p^-$ type drift layer 2, and through the part of the n type body layer 4 that is located above the $p^-$ type drift layer 2. Then, the gate trench TR1 reaches the middle of the $p^-$ type drift layer 2.

As shown in FIGS. 5 to 8, the two directions that intersect each other, preferably, at right angles each other in the upper surface of the semiconductor substrate SUB, are defined as the X axis direction and the Y axis direction. Further, the direction perpendicular to the upper surface of the semiconductor substrate SUB, namely, the vertical direction is defined as the Z axis direction. At this time, preferably, the respective gate trenches TR1 extend in the Y axis direction and are arranged at intervals from each other in the X axis direction in the plan view. Further, the $p^-$ type drift layer 2 and the $n^-$ type semiconductor region 3 extend in the Y axis direction and are arranged alternately in the X axis direction. In other words, the $n^-$ type semiconductor region 3 is a columnar semiconductor region with a polarity opposite to the $p^-$ type drift layer 2.

Note that in the present specification, the phrase "in the plan view" means that when seen from the direction perpendicular to the upper surface of the semiconductor substrate SUB.

In the cell area AR1, the gate insulating film GI1 is formed in an inner wall of the gate trench TR1. For example, the gate insulating film GI1 is comprised of silicon oxide film or other thin film materials.

In the examples shown FIGS. 5 to 8, the gate insulating film GI1 is formed in the inner wall of the gate trench TR1. Further, the n type body layer 4 and the $p^+$ type source layer 5 are brought into contact with the gate insulating film GI1.

In the cell area AR1, the gate electrode GE1 is formed to fill the gate trench TR1, over the gate insulating film GI1. The gate electrode GE1 is comprised of a polysilicon film in which an n type impurity, such as, for example, phosphorus (P) or arsenic (As) is diffused.

In the cell area AR1, the interlayer insulating film IL1 is formed so as to cover the gate electrode GE1 and the $p^+$ type source layer 5. The $p^+$ type source layer 5 is formed over the n type body layer 4, so that the interlayer insulating film IL1 is formed covering the n type body layer 4. For example, the silicon oxide film can be used as the interlayer insulating film IL1.

The contact groove CT1 as a groove is formed in the part of the interlayer insulating film IL1 located between the two adjacent gate trenches TR1, as well as the $p^+$ type source layer 5 in the plan view. The contact groove CT1 passes through the part of the interlayer insulating film IL1 that is located between the two adjacent gate trenches TR1 in the plan view, and through the $p^+$ type source layer 5. Then, the contact groove CT1 reaches the middle of the n type body layer 4.

Preferably, the contact groove CT1 passes through the part of the $p^+$ type source layer 5 that is located above the $n^-$ type semiconductor region 3, and reaches the part of n type body layer 4 that is located above the $n^-$ type semiconductor region 3. This configuration enables the source electrode SE1 formed within the contact groove CT1 to be arranged between the two adjacent gate trenches TR1.

When the respective gate trenches TR1 extend in the Y axis direction and are arranged at intervals from each other in the X axis direction in the plan view, the respective contact grooves CT1 preferably extend in the Y direction and are formed at intervals from each other in the X axis direction in the plan view.

The source electrode SE1 and the source wiring SW1 are formed within the contact groove CT1 and over the interlayer insulating film IL1. The contact groove CT1 is an electrode formed within the contact groove CT1 so as to fill the inside of the contact groove CT1. The source wiring SW1 is an electrode formed over the source electrode SE1 and over the interlayer insulating film IL1, on the outside of the contact groove CT1. The source wiring SW1 is electrically coupled to the source electrode SE1 The source electrode SE1 is brought into contact with the part of the n type body layer 4 that is located between the two adjacent gate trenches TR1, as well as the $p^+$ type source layer 5. The source wiring SW1 is electrically coupled to the n type body layer 4 and the $p^+$ type source layer 5, which configure the MOSFET 13, through the source electrode SE1.

As the source electrode SE1, it is possible to use a conductive film comprised of, for example, titanium nitride (TiN) film or titanium tungsten (TiW) film. Further, as the source wiring SW1, it is possible to use a conductive film comprised of, for example, aluminum (Al) film, or a conductive film comprised of aluminum film containing, for example, silicon (Si) or copper (Cu). By using such source electrode SE1 and source wiring SW1, the n type body layer 4 and the $p^+$ type source layer 5 can be electrically coupled to the source electrode SE1 and the source wiring SW1 with low resistance.

The drain electrode DE1 is an electrode formed on the side of the lower surface of the $p^+$ type drain layer 1. The drain electrode DE1 is electrically coupled to the semiconductor substrate SUB comprised of the $p^+$ type drain layer 1. As the drain electrode DE1, it is possible to use a conductive film comprised of, for example, a silver (Ag)-based, gold (Au)-based, or other metal-based alloy. By using such a conductive film, the drain electrode DE1 and the $p^+$ type drain layer 1 can be electrically coupled with low resistance.

As described above, the MOSFET 13, which is a p-channel trench gate vertical MOSFET, is formed by the $p^-$ type drift layer 2, the n type body layer 4, the $p^+$ type source layer 5, the gate insulating film GI1, and the gate electrode GE1. Further, the MOSFET 13 has the $n^-$ type semiconductor region 3 formed adjacent to the $p^-$ type drift layer 2, in which the super junction structure is formed by the $p^-$ type drift layer 2 and the $n^-$ type semiconductor region 3. In other words, the semiconductor device according to the present embodiment is a semiconductor device including a p-channel trench gate vertical MOSFET having the super junction structure.

With the MOSFET 13 which is a p-channel trench gate vertical MOSFET having the super junction structure, it is possible to increase the source-drain breakdown voltage even if the p type impurity concentration in the $p^-$ type drift layer 2 is increased as compared to the case of not having the super junction structure. In other words, it is possible to reduce the ON resistance while keeping the breakdown voltage of the MOSFET 13 constant.

Thus, when the MOSFET 11 comprised of the p-channel MOSFET 13 of the present embodiment is used as MOSFET 10 on the high side of the inverter INV (see FIG. 1), it is possible to simplify the control circuit CTC2 of the inverter INV (see FIG. 1) and to reduce the ON resistance of the p-channel MOSFET 11. In other words, the inverter INV (see FIG. 1) is preferably formed by the MOSFET 13.

<Manufacturing Method of the Semiconductor Device in the Cell Area>

Figure 9:
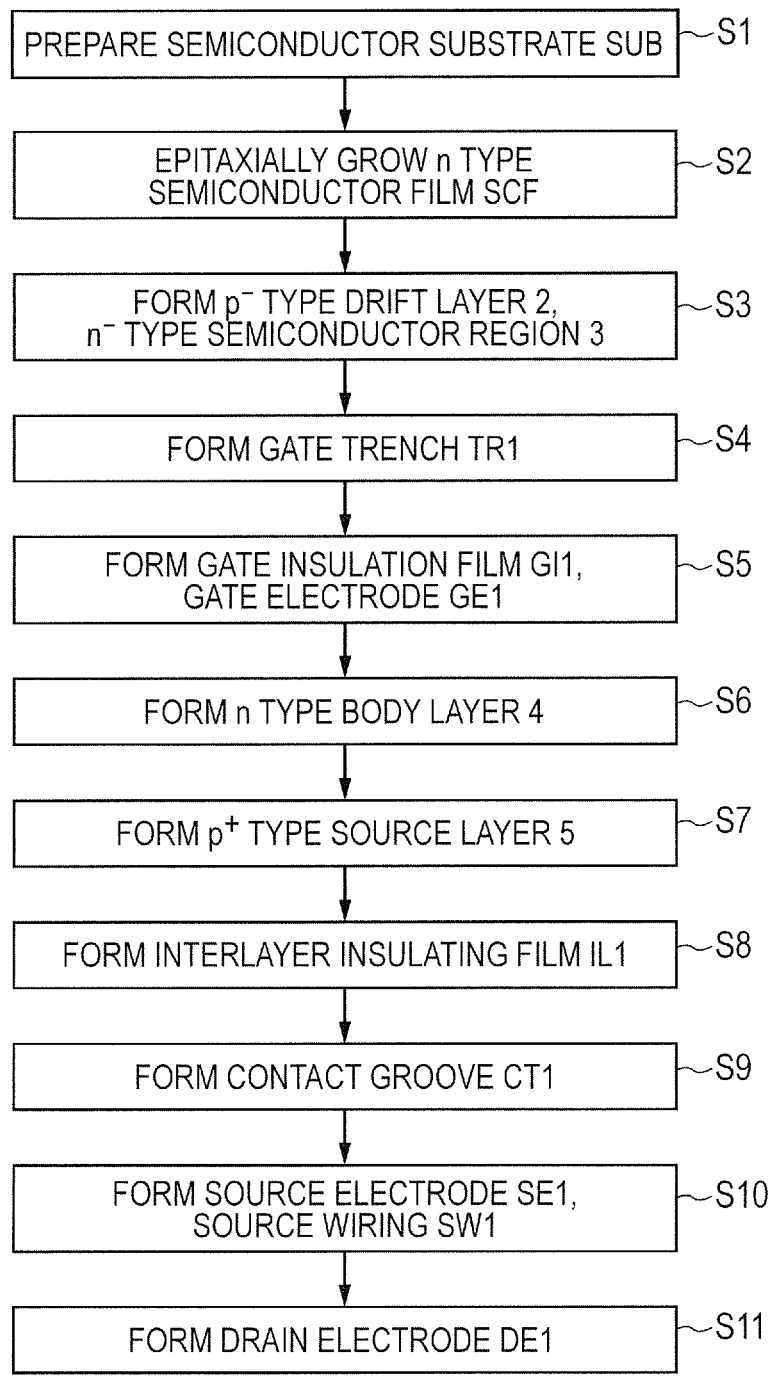
FIG. 9 is a manufacturing process flow chart showing a part of the manufacturing process of the semiconductor device according to the embodiment.

The next describes the manufacturing method of the semiconductor device in the cell area according to the present embodiment. FIG. 9 is a manufacturing process flow diagram showing a part of the manufacturing process of the semiconductor device according to the embodiment. FIGS. 10 to 21 are essential-part cross-sectional views in the manufacturing process of the semiconductor device according to the embodiment. FIGS. 10 to 21 correspond to the cross-sectional view of FIG. 8.

Figure 10:
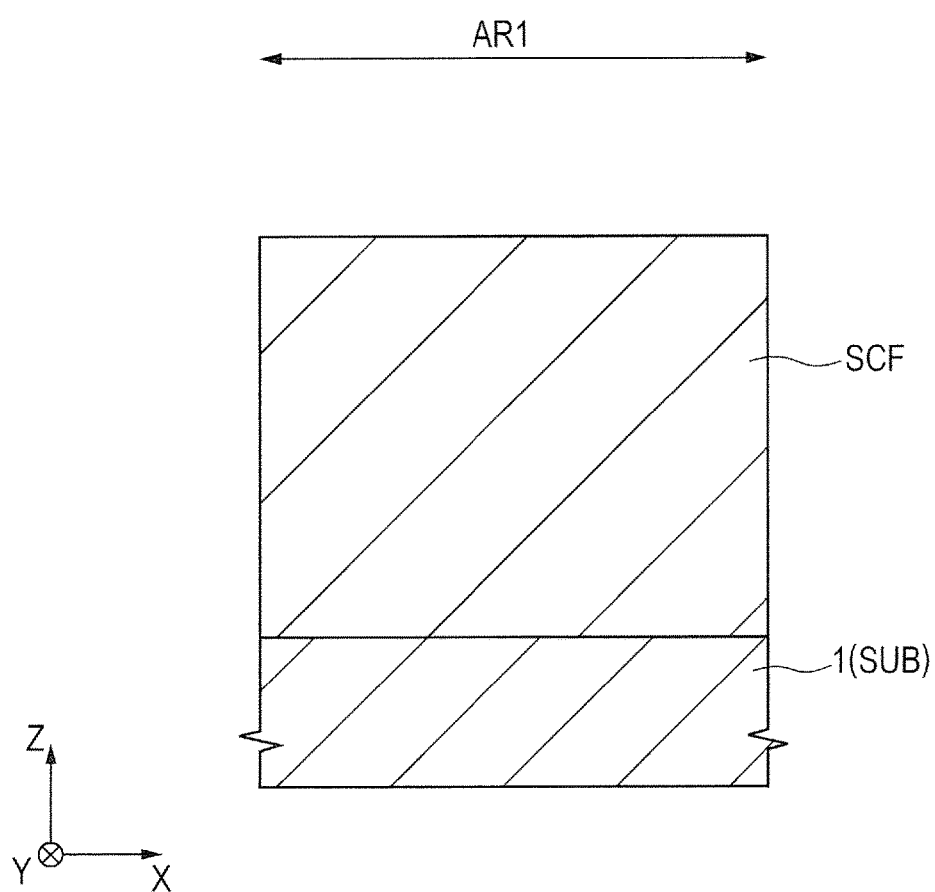
FIG. 10 is an essential-part cross-sectional view in the manufacturing process of the semiconductor device according to the embodiment.

First, as shown in FIG. 10, the semiconductor substrate SUB is prepared (Step S1 in FIG. 9). The semiconductor substrate SUB has an upper surface as one main surface and a lower surface as another main surface. Further, the semiconductor substrate SUB is comprised of the $p^+$ type drain layer 1. The $p^+$ type drain layer 1 is comprised of silicon (Si) in which a p type impurity, such as, for example, boron (B) is diffuse, and is comprised of a semiconductor whose conductivity type is p type. In other words, the semiconductor substrate SUB is a p type semiconductor substrate. The p type impurity concentration in the $p^+$ type drain layer 1 is higher than the p type impurity concentration in the $p^+$ type drift layer 2 described below. For example, the p type impurity concentration in the $p^+$ type drain layer 1 can be set to about $1\times10^{16}$ to $1\times10^{18}$ $cm^{-3}$. Note that various p type semiconductors other than silicon can be used as the $p^+$ type drain layer 1.

The semiconductor substrate SUB has the cell area AR1 as a part of the area of the upper surface, as well as the gate wiring lead area AR2 as another part of the area of the upper surface, as described with reference to FIG. 7. In the following description, the manufacturing method of the semiconductor device in the cell area AR1 will be described as representing the cell area AR1 and the gate wiring lead area AR2. Thus, FIGS. 10 to 21 are essential-part cross-sectional views in the manufacturing process of the semiconductor device in the cell area AR1.

Next, as shown in FIG. 10, the n type semiconductor film SCF is epitaxially grown (Step S2 in FIG. 9). In Step S2, in the cell area AR1 of the upper surface of the semiconductor substrate SUB, the n type semiconductor film SCF is epitaxially grown over the $p^+$ type drain layer 1, namely, over the upper surface of the semiconductor substrate SUB.

More specifically, the n type semiconductor film SCF in which an n type impurity, such as, for example, phosphorus (P) or arsenic (As) is introduced, can be formed by the epitaxial growth technique such as chemical vapor deposition (CVD) method. Further, the n type impurity concentration in the n type semiconductor film SCF can be set, for example, to about $5\times10^{13}$ to $5\times10^{14}$ $cm^{-3}$. Further, the thickness of the n type semiconductor film SCF can be set, for example, to about 40 to 300 μm.

Figure 11:
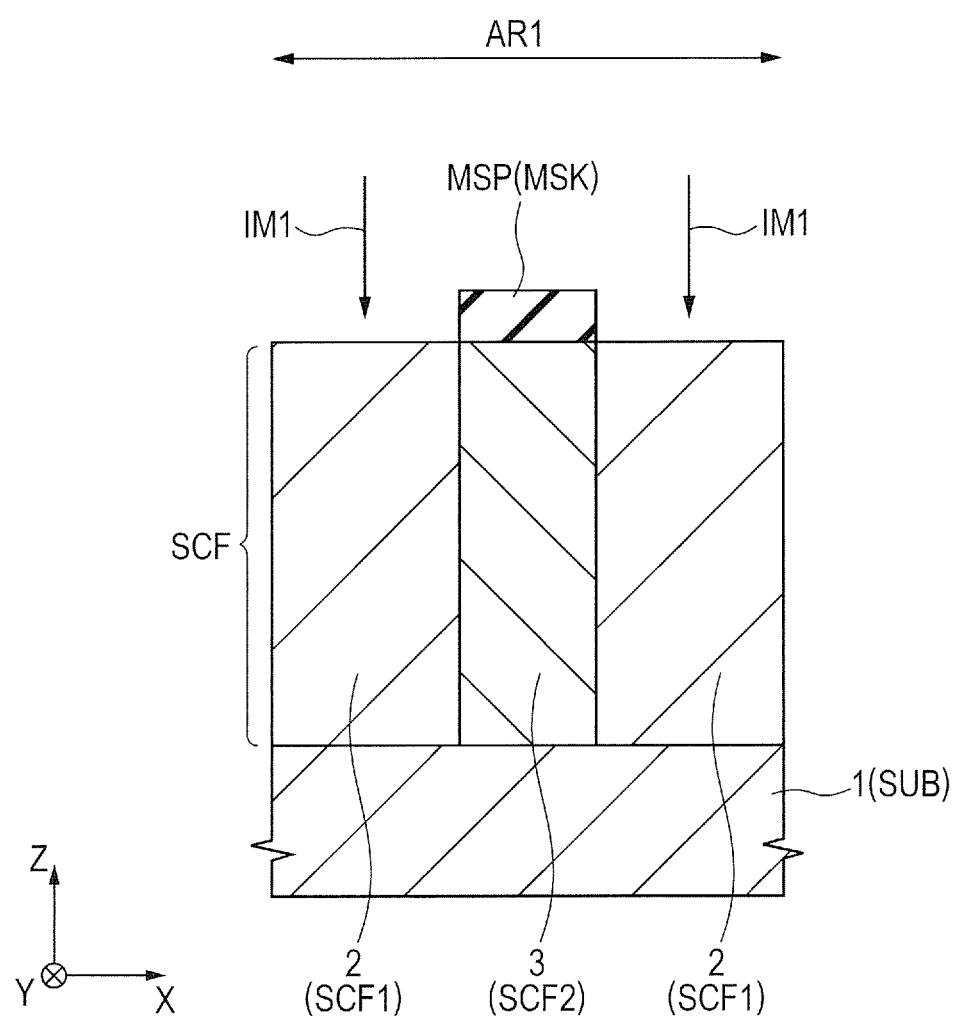
FIG. 11 an essential-part cross-sectional view in the manufacturing process of the semiconductor device according to the embodiment.

Next, as shown in FIG. 11, the $p^-$ type drift layer 2 and the $n^-$ type semiconductor region 3 are formed (Step S3 in FIG. 9). In Step S3, the p type impurity is ion implanted into the area SCF1 of the n type semiconductor film SCF, and the p type impurity is not ion implanted into the area SCF2 of the n type semiconductor film SCF, which is adjacent to the area SCF1. In this way, the $p^-$ type drift layer 2 comprised of the area SCF1 in which the p type impurity is introduced, as well as the $n^-$ type semiconductor region 3 comprised of the area SCF2 in which the p type impurity is not introduced are formed.

The p⁻ type drift layer 2 is comprised of silicon (Si) in which a p type impurity, such as, for example, boron (B) is introduced, and is comprised of a semiconductor whose conductivity type is p type. The n⁻ type semiconductor region 3 is a semiconductor region whose conductivity type is n type, in which an n type impurity, such as, for example, phosphorus (P) or arsenic (As) is introduced.

More specifically, a mask film MSK comprised of an insulating film, for example, comprised of silicon oxide film and the like, is first formed over the areas SCF1 and SCF2. Next, a resist film of photoresist is applied over the mask film MSK. Then, the resist film of the part located above the area SCF1 is removed by exposure and development to the applied resist film, to form a resist pattern (not shown) comprised of the part of the resist film that is located above the area SCF2. Next, the part of the mask film MSK that is located above the area SCF1 is removed by dry etching using the formed resist pattern as a mask, to form a mask pattern MSP comprised of the part of the mask film MSK that is located above the area SCF2. In other words, the SCF2 is covered by the mask film MSK, and the area SCF1 is exposed from the mask film MSK.

Next, p type impurity ions IM1, such as, for example, boron (B) are introduced into the upper part of the n type semiconductor film SCF, for example, by an ion implantation method. At this time, the p type impurity ions IM1 are implanted into the area SCF1 exposed from the mask film MSK, and the p type impurity ions IM1 are not implanted into the area SCF1. In this way, the p⁻ type drift layer 2 comprised of the area SCF1, in which the p type impurity is introduced, is formed. Further, the n⁻ type semiconductor region 3 comprised of the area SCF2, in which the n type impurity is introduced and the p type impurity is not introduced, is formed. Note that, although not shown in FIG. 11, the mask film MSK covering the area SCF2 is removed afterwards.

In the implantation of the impurity ions IM1 of boron (B), the implantation can be performed in two stages. The implantation conditions of the first stage are as follows: the implantation energy is 1300 keV and the dose amount is $1.4 \times 10^{13}$ cm⁻². Further, the implantation conditions of the second stage are as follows: the implantation energy is 750 keV and the dose amount is $1.2 \times 10^{13}$ cm⁻².

The p type impurity concentration in the p⁻ type drift layer 2 is lower than the p type impurity concentration in the p⁺ type drain layer 1, and is set to, for example, about $5 \times 10^{13}$ to $5 \times 10^{14}$ cm⁻³. Further, the n type impurity concentration in the n⁻ type semiconductor region 3 is approximately equal to the n type impurity concentration in the n type semiconductor film SCF, and is set to, for example, about $5 \times 10^{13}$ to $5 \times 10^{14}$ cm⁻³.

Further, the range of the impurity ions IM1 when the p type impurity ions IM1, such as, for example, boron (B) are implanted, namely, the depth from the point at which the impurity ions IM1 penetrate the n type semiconductor film SCF to the point at which the impurity ions IM1 stop penetrating, is deeper than the range of the impurity ions when the n type impurity ions, such as phosphorus (P) or arsenic (As) are implanted. Thus, the lower surface of the p⁻ type drift layer 2 is located at the same height as the upper surface of the p⁺ type drain layer 1. Then, the p⁻ type drift layer 2 that is formed in Step S3 is brought into contact with the p⁺ type drain layer 1. On the other hand, the n⁻ type semiconductor region 3 is comprised of the area SCF2 in which the p type impurity is not introduced, so that the lower surface of the n⁻ type semiconductor region 3 is located at the same height as the upper surface of the p⁺ type drain layer 1. Then, the n⁻ type semiconductor region 3 is brought into contact with the p⁺ type drain layer 1.

For this reason, it is possible to easily form the super junction structure including the interface between the p⁻ type drift layer 2 and the n⁻ type semiconductor region 3 so as to reach the lower surface to the upper surface of the semiconductor film SCF. In other words, the super junction structure can also be formed in the lower part of the semiconductor film SCF, namely, in the part of the semiconductor film SCF contacting the p⁺ type drain layer 1. Thus, it is possible to increase the area of the interface between the p⁻ type drift layer 2 and the n⁻ type semiconductor area 3.

Figure 12:
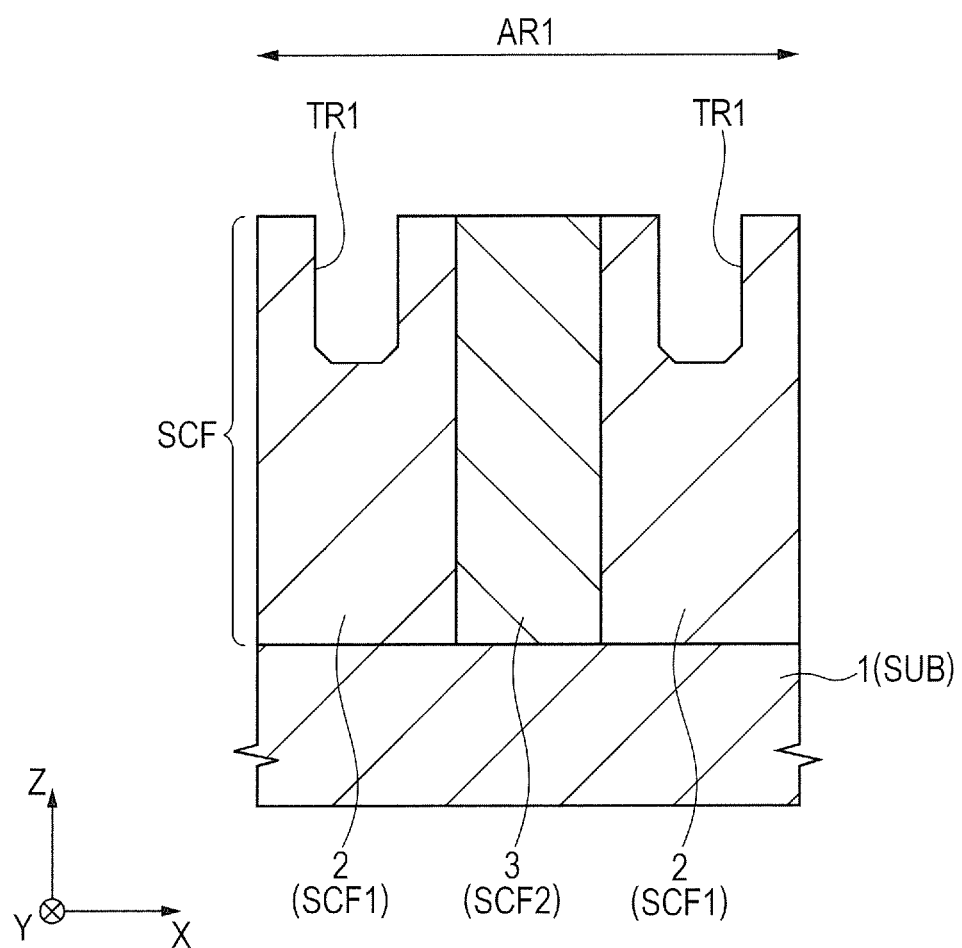
FIG. 12 is an essential-part cross-sectional view in the manufacturing process of the semiconductor device according to the embodiment.

Next, as shown in FIG. 12, the gate trench TR1 is formed (Step S4 in FIG. 9). In the process of forming Step S4, the gate trench TR1 is formed over the upper surface of the p⁻ type drift layer 2 in the cell area AR1 by the photolithography technique and by the etching technique. The gate trench TR1 reaches the depth of the middle of the p⁻ type drift layer 2 from the upper surface of the p⁻ type drift layer 2. In other words, the gate trench TR1 is formed to reach the depth of the middle of the p⁻ type drift layer 2 from the upper surface of the semiconductor film SCF.

More specifically, first an insulating film (not shown), for example, comprised of silicon oxide film and the like is formed over the p⁻ type drift layer 2. Next, a resist film of photoresist is applied over the insulating film, to form a resist pattern (not shown) by exposure and development to the applied resist film. Next, a pattern (not shown) of the insulating film is formed by dry etching using the formed resist pattern as a mask. Next, the gate trench TR1 is formed by dry etching using the pattern of the insulating film as a mask.

Preferably, the respective gate trenches TR1 extend in the Y axis direction and are arranged at intervals from each other in the X axis direction in the plan view.

Figure 13:
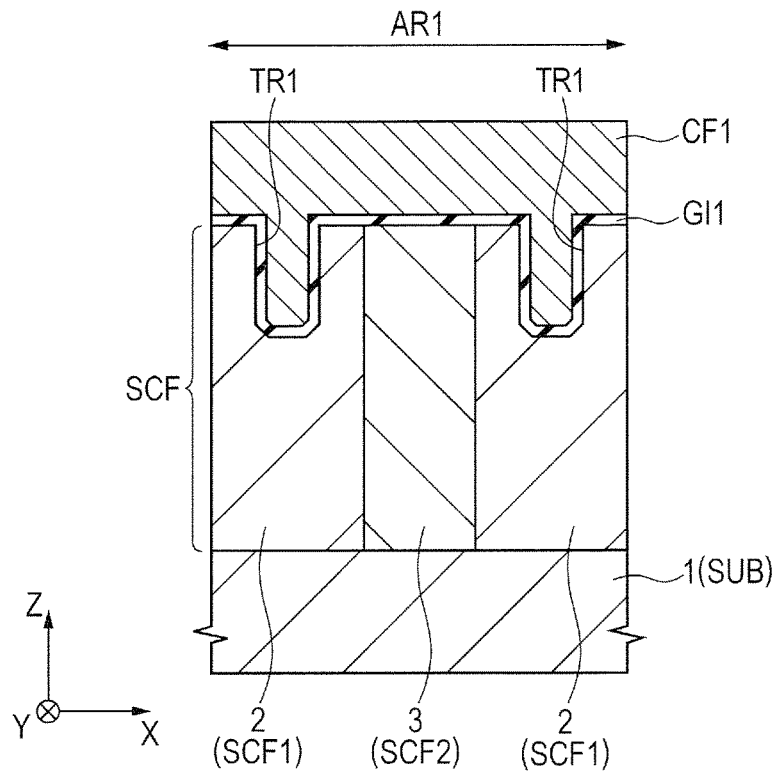
FIG. 13 is an essential-part cross-sectional view in the manufacturing process of the semiconductor device according to the embodiment.
Figure 14:
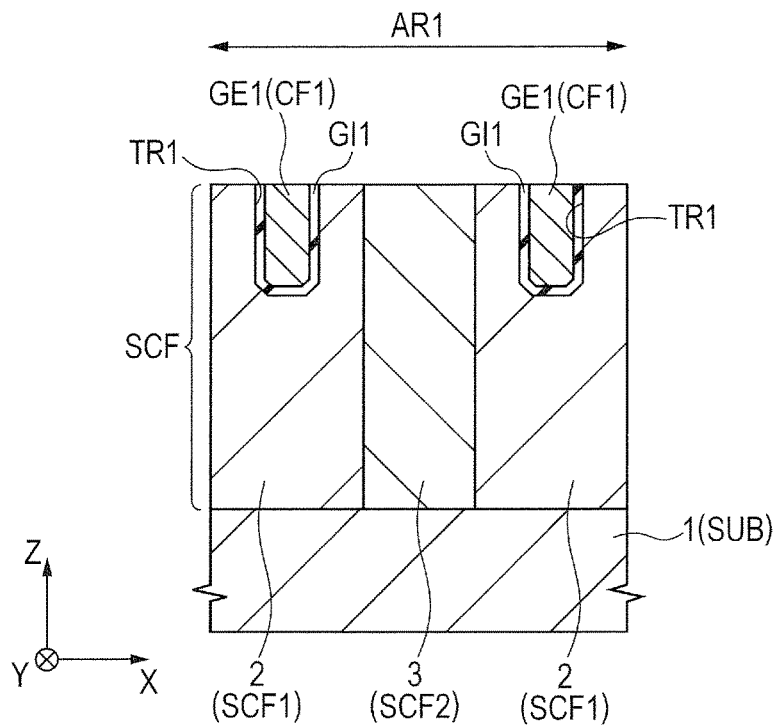
FIG. 14 is an essential-part cross-sectional view in the manufacturing process of the semiconductor device according to the embodiment.

Next, as shown in FIGS. 13 and 14, the gate insulating film GI1 and the gate electrode GE1 are formed (Step S5 in FIG. 9).

In Step S5, as shown in FIG. 13, the gate insulating film GI1 is first formed. In the process of forming the gate insulating film GI1, the gate insulating film GI1 is formed in the inner wall of the gate trench TR1 within the gate trench TR1. At this time, the gate insulating film GI1 is formed over the p⁻ type drift layer 2 and over the n⁻ type semiconductor region 3, on the outside of the gate trench TR1.

As the gate insulating film GI1, for example, it is possible to form a gate insulating film comprised of a silicon oxide (SiO) film by a thermal oxidation method. Alternatively, as the gate insulating film GI1, it is possible to form a gate insulating film comprised of silicon oxynitride (SiON) film, silicon nitride (SiN) film, or high conductive film with a higher conductivity higher than the silicon nitride film, for example, by using the CVD method.

In Step S5, as shown in FIGS. 13 and 14, the gate electrode GE1 is next formed. In the process of forming the gate electrode GE1, the gate electrode GE1 is formed to fill the gate trench TR1, over the gate insulating film GI1.

First, within the gate trench TR1, a conductive film CF1 of a polysilicon film in which an n type impurity, such as, for example, phosphorus (P) or arsenic (As) is introduced, is formed to fill the gate trench TR1 over the gate insulating film GI1, for example, by using the CVD method. At this time, the conductive film CF1 of a polysilicon film in which the n type impurity described above is introduced, is formed over the p⁻ type drift layer 2 and over the n⁻ type semiconductor region 3 through the gate insulating film II, on the outside of the gate trench TR1, for example, by using the CVD method.

Or, it is also possible that the conductive film CF1 of a polysilicon film, in which the n type impurity is not introduced, is formed within the gate trench TR1 and over the p⁻ type drift layer 2 as well as the n⁻ type semiconductor region 3, and then the n type impurity described above is introduced into the conductive film CF1 comprised of polysilicon by the ion implantation method.

In Step S5, as shown in FIG. 14, the patterning of the conductive film CF1 of a polysilicon film is next performed by the photolithography technique and by the etching technique. In the process of patterning the conductive film CF1 of a polysilicon film, the conductive film CF1 formed over the p⁻ type drift layer 2 and the n⁻ type semiconductor region 3 through the gate insulating film GI1 is removed, for example, by dry etching to allow the conductive film CF1 to be left only within the gate trench TR1. In this way, it is possible to form the gate electrode GE1 of the conductive film CF1 to fill the gate trench TR1.

Note that in the example shown in FIG. 14, the gate insulating film GI1 of the part formed over the p⁻ type drift layer 2 and over the n⁻ type semiconductor region 3 is also removed together with the conductive film CF1 of a polysilicon film.

Figure 15:
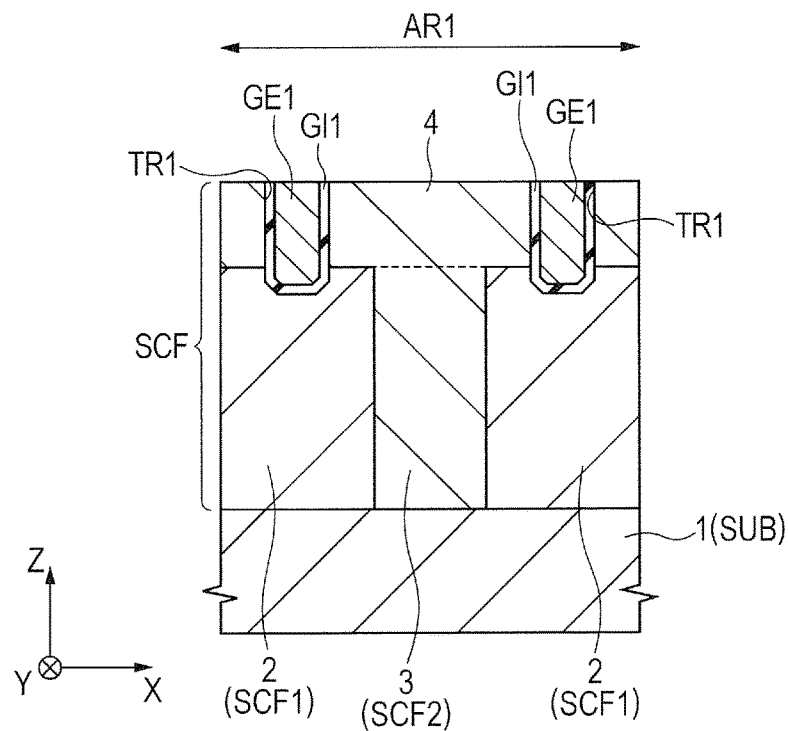
FIG. 15 is an essential-part cross-sectional view in the manufacturing process of the semiconductor device according to the embodiment.

Next, as shown in FIG. 15, the n type body layer 4 is formed (Step S6 in FIG. 9). In Step S6, an n type impurity, such as, for example, phosphorus (P) or arsenic (As) is implanted into the upper part of the p⁻ type drift layer 2 and the upper part of the n⁻ type semiconductor region 3, for example, by using the ion implantation method. In this way, the n type impurity is introduced into the upper part of the p⁻ type drift layer 2 and the upper part of the n⁻ type semiconductor region 3, to form the n type body layer 4 contacting the gate insulating film GI1.

As described above, preferably, the n type impurity concentration in the n type body layer 4 that is formed in Step S6 is higher than the n type impurity concentration in the n⁻ type semiconductor region 3 that is formed in Step S3. For example, the n type impurity concentration in the n type body layer 4 can be set to about $5 \times 10^{15}$ to $1 \times 10^{18}$ cm$^{-3}$.

Further, preferably, the n type body layer 4 is formed so that the lower surface of the n type body layer 4 is higher than the bottom of the gate trench TR1. In this way, the gate trench TR1 is formed passing through the n type body layer 4 to reach the middle of the p⁻ type drift layer 2. This configuration enables the n type body layer 4 to be arranged so that the lower edge of the n type body layer 4 as the channel region is adjacent to the gate electrode GE1 through the gate insulating film GI1.

Figure 16:
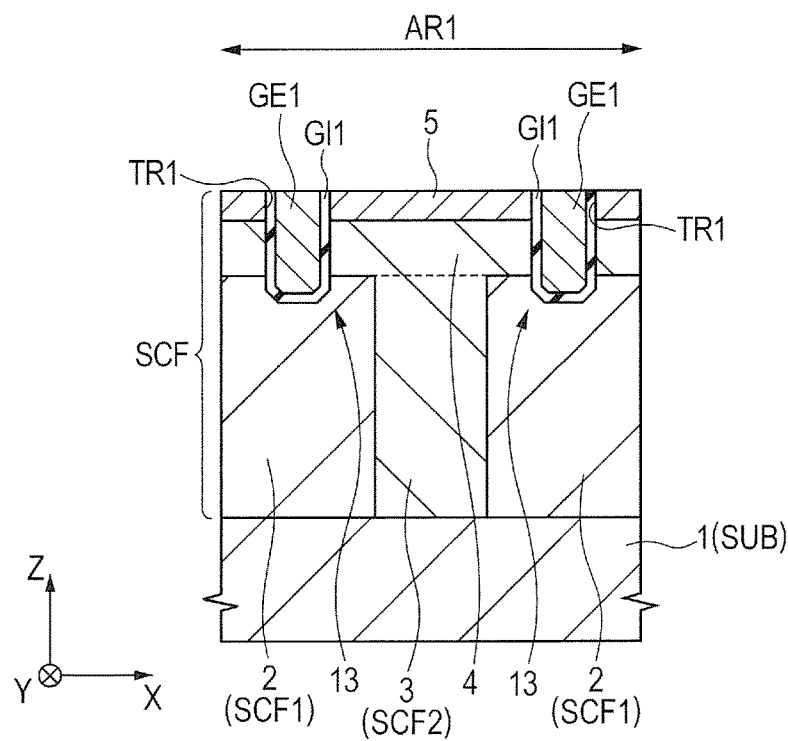
FIG. 16 is an essential-part cross-sectional view in the manufacturing process of the semiconductor device according to the embodiment.

Next, as shown in FIG. 16, the p⁺ type source layer 5 is formed (Step 7 in FIG. 9). In Step S7, a p type impurity, such as, for example, boron (B) is introduced over the upper part of the n type body layer 4, for example, by using the ion implantation method. In this way, the p⁺ type source layer 5 contacting the gate insulating film GI1 is formed over the upper part of the n type body layer 4. For example, the p type impurity concentration in the p⁺ type source layer 4 can be set to $1 \times 10^{18}$ to $5 \times 10^{20}$ cm$^{-3}$.

At this time, the MOSFET 13 which is a p-channel trench gate vertical MOSFET is formed by the p⁻ type drift layer 2, the n type body layer 4, the p⁺ type source layer 5, the gate insulating film GI1, and the gate electrode GE1. Further, the MOSFET 13 has the n⁻ type semiconductor region 3 formed adjacent to the p⁻ type drift layer 2. Then, the super junction structure is formed by the p⁻ type drift layer 2 and the n⁻ type semiconductor region 3. In other words, the manufacturing method of the semiconductor device according to the present embodiment is a manufacturing method of the semiconductor device including a p-channel trench gate vertical MOSFET having the super junction structure.

With the MOSFET 13 having the super junction structure, it is possible to increase the source-drain breakdown voltage even if the p type impurity concentration in the p⁻ type drift layer 2 is increased as compared to the case of not having the super junction structure. In other words, it is possible to reduce the ON resistance while keeping the breakdown voltage of the MOSFET 13 constant. Thus, when the semiconductor device according to the present embodiment is used as MOSFET on the high side of the inverter, as described with reference to FIGS. 1 and 2, it is possible to simplify the control circuit CTC2 (see FIG. 1) of the inverter INV (see FIG. 1) and to reduce the ON resistance of the p-channel MOSFET. In other words, preferably, the inverter INV (see FIG. 1) is formed by the MOSFET 13.

Note that it is also possible that the n type body layer 4 and the p⁺ type source layer 5 are formed before the gate trench TR1 is formed, and that the gate trench TR1 is formed passing through the p⁺ type source layer 5 and the n type body layer 4 so as to reach the depth of the middle of the p⁻ type drift layer 2. In this case also, the gate trench TR1 is formed to reach the depth of the middle of the p⁻ type drift layer 2 from the upper surface of the semiconductor film SCF.

Further, the n type body layer 4 and the p⁺ type source layer 5 are brought into contact with the gate insulating film GI1. This configuration enables the n type body layer 4 to be arranged so that the upper edge of the n type body layer 4 as the channel region is adjacent to the gate electrode GE1 through the gate insulating film GI1.

Figure 17:
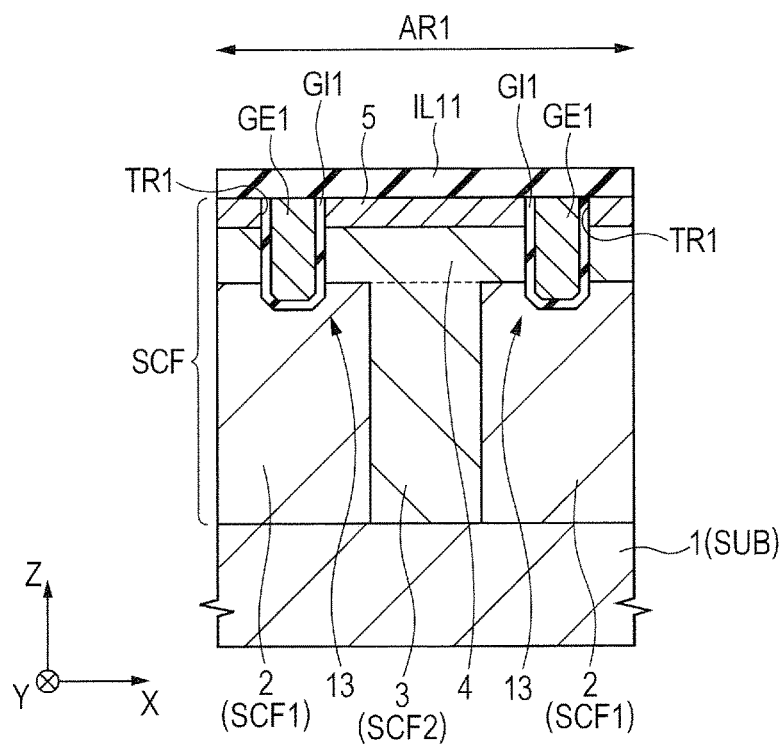
FIG. 17 is an essential-part cross-sectional view in the manufacturing process of the semiconductor device according to the embodiment.
Figure 18:
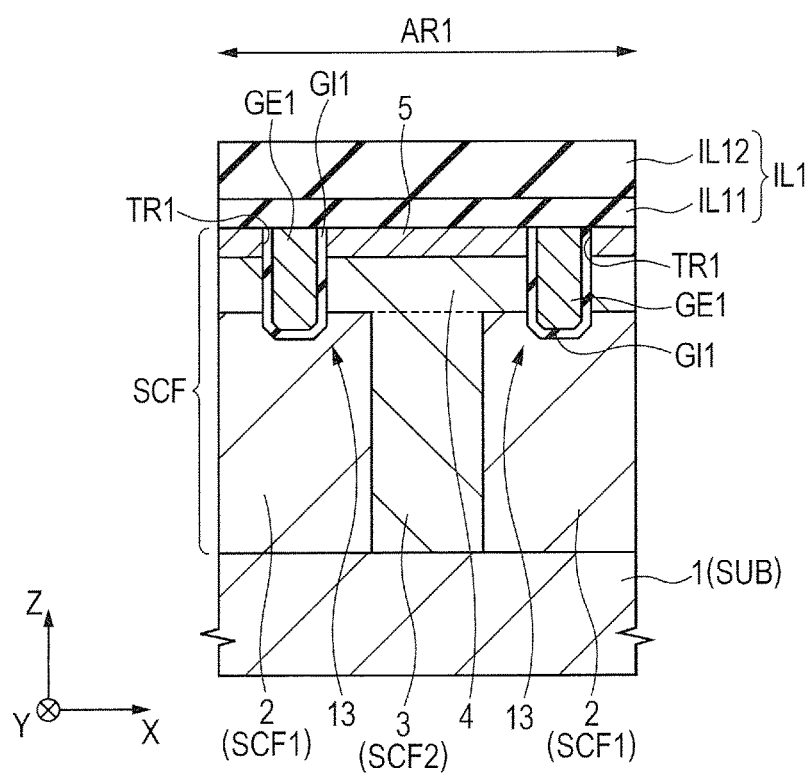
FIG. 18 is an essential-part cross-sectional view in the manufacturing process of the semiconductor device according to the embodiment.

Next, as shown in FIGS. 17 and 18, the interlayer insulating film IL1 is formed (Step 8 in FIG. 9).

In Step S8, as shown in FIG. 17, an insulating film IL11, for example, comprised of silicon oxide film is first formed over the p⁺ type source layer 5 as well as the gate electrode GE1, for example, by using the CVD method.

In Step S8, as shown in FIG. 18, an insulating film IL12, for example, comprised of boron phosphorus silicon glass (BPSG) film is next formed over the insulating film IL11, for example, by using the CVD method. In this way, the interlayer insulating film IL1 comprised of the insulating films IL11 and IL12 is formed over the p⁺ type source layer 5.

Figure 19:
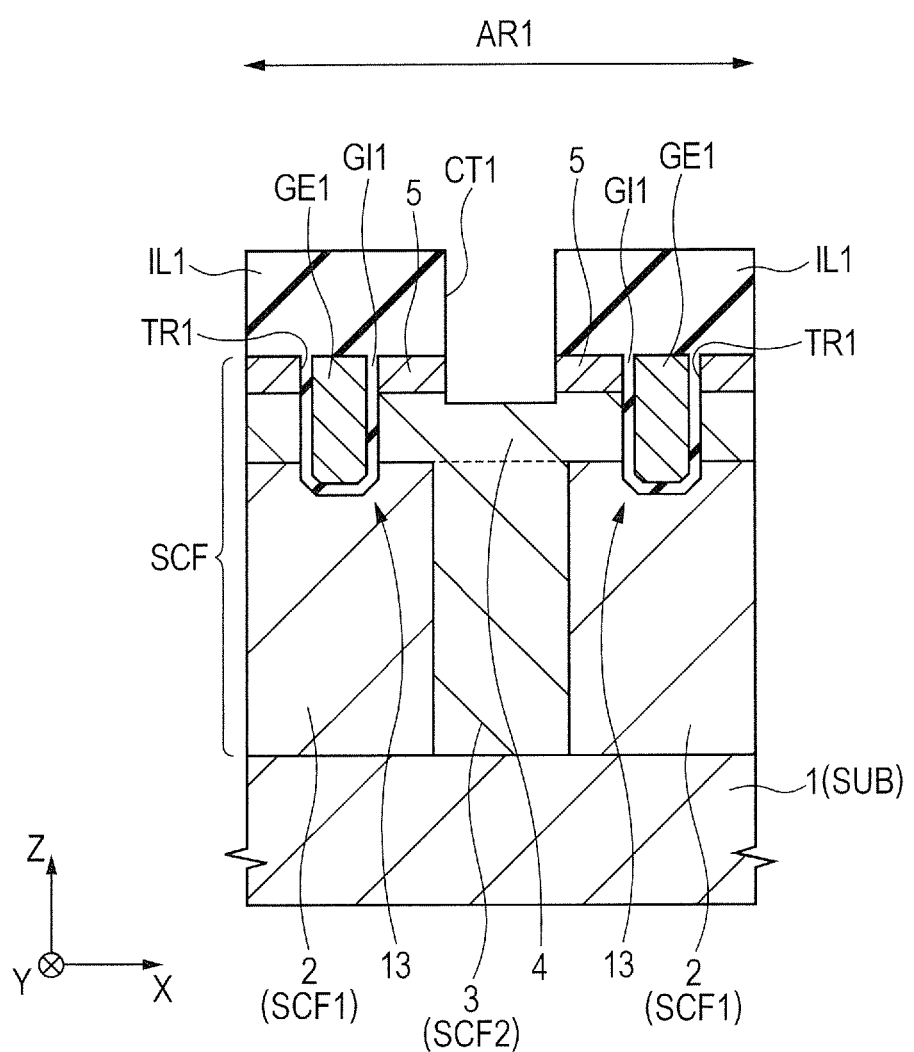
FIG. 19 is an essential-part cross-sectional view in the manufacturing process of the semiconductor device according to the embodiment.

Next, as shown in FIG. 19, the contact groove CT1 is formed (Step S9 in FIG. 9). In Step S9, the contact groove CT1 is formed as a groove passing through the interlayer insulating film IL1 and the p⁺ type source layer 5 so as to reach the middle of the n type body layer 4 by the photolithography technique and by the etching technique.

More specifically, first a resist film of photoresist is applied over the interlayer insulating film IL1 to form a resist pattern (not shown) by exposure and development to the applied resist pattern. Next, the contact groove CT1 is formed passing through the interlayer insulating film IL1 and the p⁺ type source layer 5 so as to reach the middle of the n type body layer 4 by dry etching with the formed resist pattern as a mask.

Preferably, the respective contact grooves CT1 extend in the Y axis direction and are arranged at intervals from each other in the X axis direction in the plan view.

Further, preferably, the contact groove CT1 is formed passing through the part of the p⁺ type source layer 5 that is located above the n⁻ type semiconductor region 3 so as to reach the part of the n type body layer 4 that is located above the n⁻ type semiconductor region 3.

Note that after the n type body layer 4 is formed and before the p⁺ type source layer 5 is formed, the opening may be formed to reach the middle of the n type body layer 4 from the upper surface of the n type body layer 4. Then, the p⁺ type source layer 5 may be formed by introducing a p type impurity, such as, for example, boron (B) by using the ion implantation method, into the upper part of the n type body layer 4 of the part located between the opening and the gate trench TR1 in the plan view.

Figure 20:
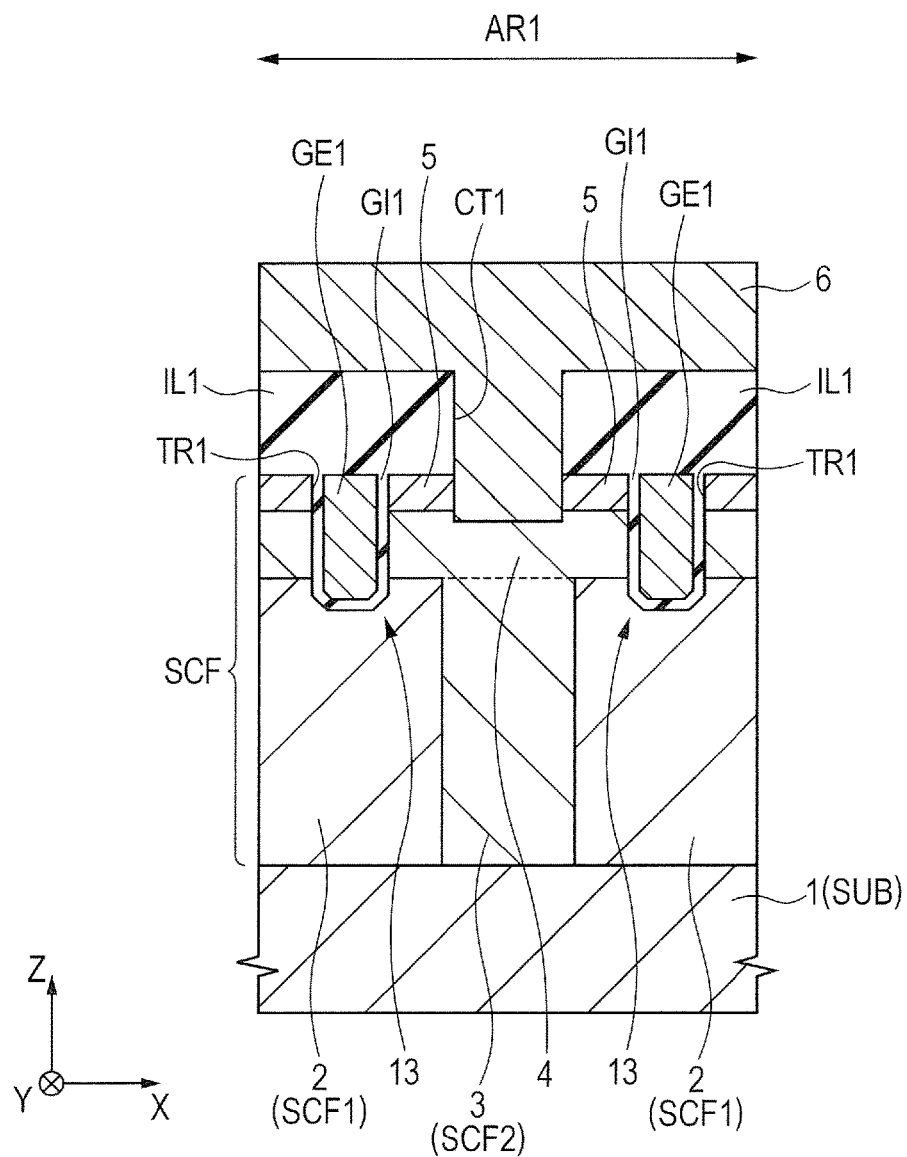
FIG. 20 is an essential-part cross-sectional view in the manufacturing process of the semiconductor device according to the embodiment.
Figure 21:
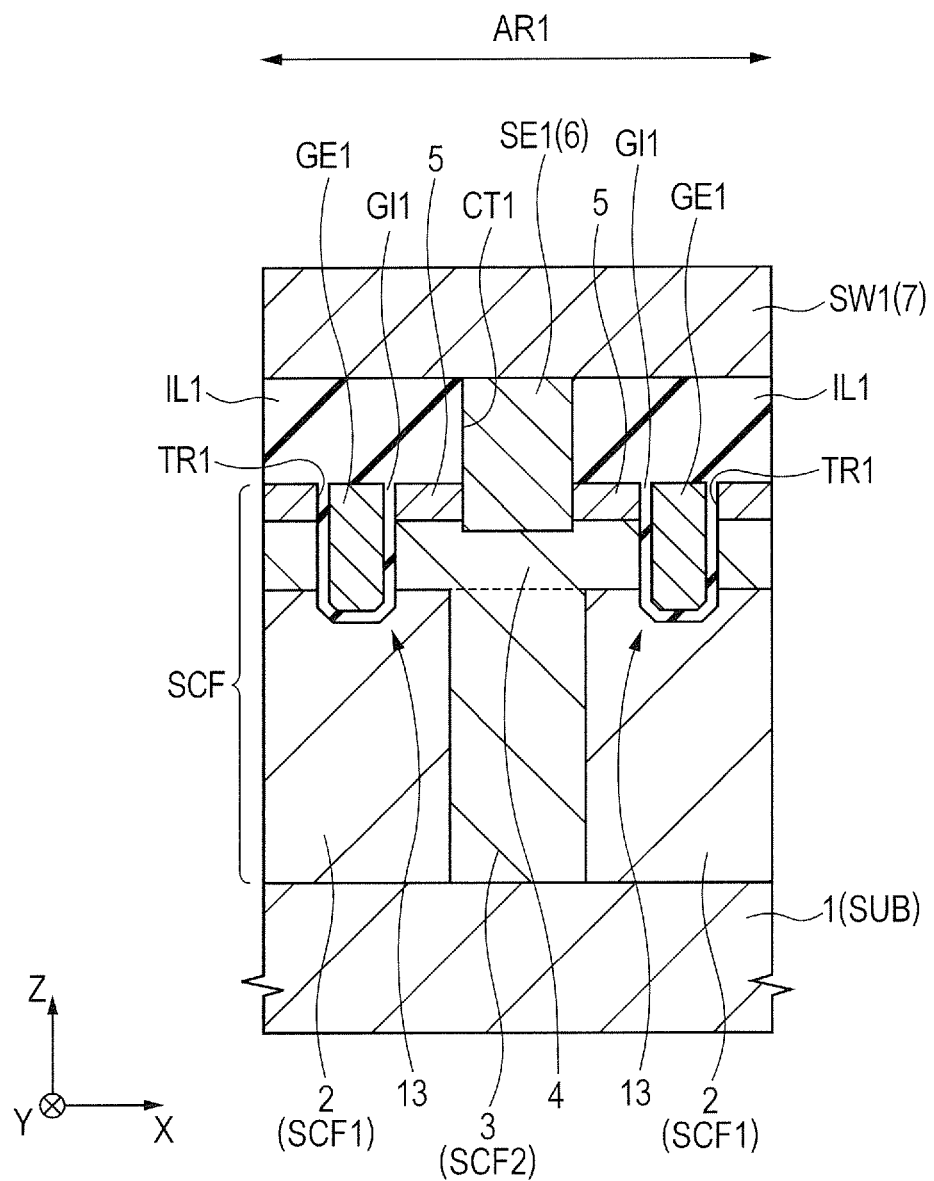
FIG. 21 is an essential-part cross-sectional view in the manufacturing process of the semiconductor device according to the embodiment.

Next, as shown in FIGS. 20 and 21, the source electrode SE1 and the source wiring SW1 are formed (Step S10 in FIG. 9).

In Step S10, as shown in FIG. 20, a conductive film 6 is first formed in the contact groove CT1 to fill the inside of the contact groove CT1. At the same time, the conductive film 6 is formed over the interlayer insulating film IL1 on the outside of the contact groove CT1. As the conductive film 6, a conductive film comprised of, for example, titanium nitride (TiN) film or titanium tungsten (TiW) film can be formed, for example, by using the sputtering method or the vapor deposition method. The conductive film 6 is a conductive film having the so-called barrier properties that prevent aluminum (Al), which is the material of a conductive film 7 formed over the conductive film 6, from spreading into silicon (Si).

In Step S10, as shown in FIG. 21, the part of the conductive film 6 that is formed outside the contact groove CT1 is next removed by the etching technique or the chemical mechanical polishing (CMP) method. In this way, the source electrode SE1 of the semiconductor film 6 embedded in the contact groove CT1 is formed so as to be brought into contact with the n type body layer 4 and the p⁺ type source layer 5. In other words, the source electrode SE1 is formed to fill the contact groove CT1.

In Step S10, as shown in FIG. 21, the conductive film 7 is next formed over the source electrode SE1 embedded in the contact groove CT1, and over the interlayer insulating film IL1. For example, a conductive film comprised of aluminum (Al) film, or a conductive film comprised of aluminum film containing, for example, silicon (Si) or cooper (Cu) can be formed as the conductive film 7, for example, by using the sputtering method or the vapor deposition method.

Next, the patterning of the conductive film 7 is performed by the photolithography technique and by the etching technique. In this way, the source wiring SW1 comprised of the conductive film 7 is formed.

Next, as shown in FIG. 8, the drain electrode DE1 is formed (Step S11 in FIG. 9). In Step S11, for example, a conductive film comprised of a silver (Ag)-based, gold (Au)-based, or other metal-based alloy is formed as the drain electrode DE1, for example, by using the sputtering method or the vapor deposition method. The drain electrode DE1 is electrically coupled to the semiconductor substrate SUB.

Further, after the source wiring SW1 is formed, as shown in FIG. 7, the insulating film IF1 is formed so as to cover the source wiring SW1. Then, the insulating film IF1 above the part of the source wiring SW1 that becomes a source pad is removed by using the photolithography technique and by the etching technique. In this way, as shown in FIGS. 7 and 8, the semiconductor device including a p-channel trench gate vertical MOSFET is formed.

<Description of the Upper Junction Structure in the Lower Part of the Semiconductor Film>

Figure 22:
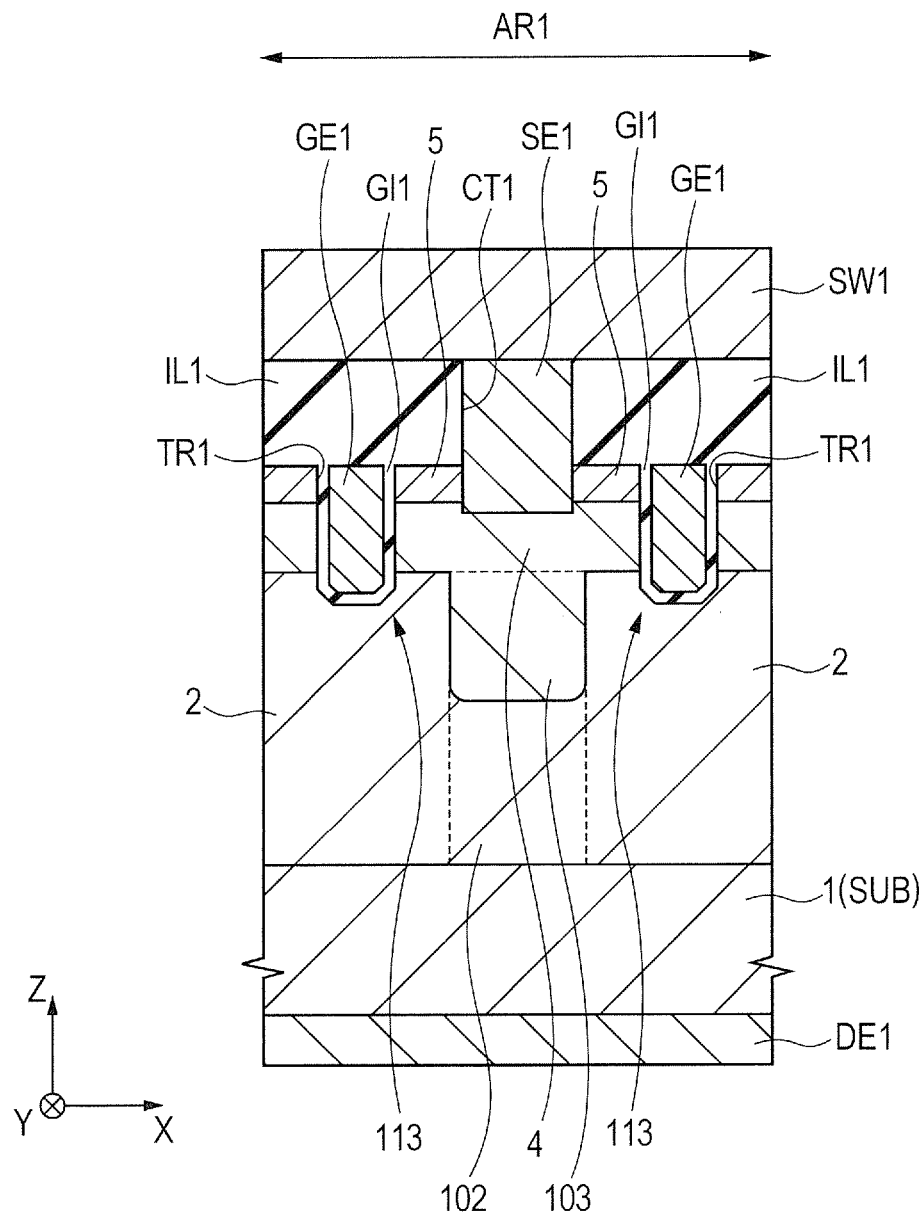
FIG. 22 is an essential-part cross-sectional view of a semiconductor device according to a second comparative example.
Figure 23:
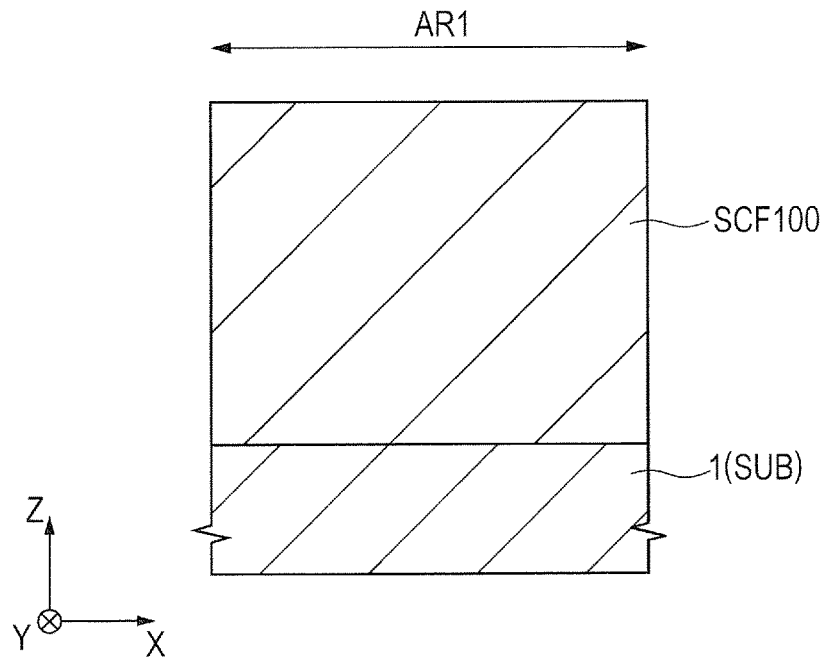
FIG. 23 is an essential-part cross-sectional view in the manufacturing process of the semiconductor device according to the second comparative example.
Figure 24:
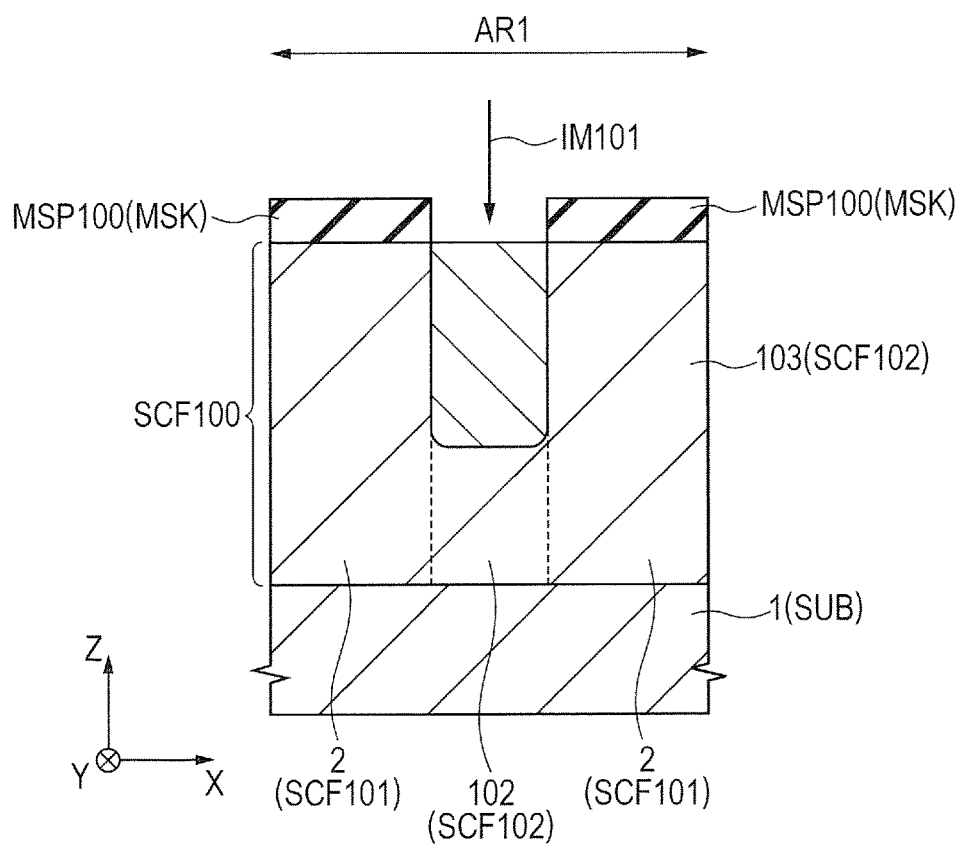
FIG. 24 is an essential-part cross-sectional view in the manufacturing process of the semiconductor device according to the second comparative example.

Next, the super junction structure in the lower part of the semiconductor film will be described by comparing with the manufacturing method of a semiconductor device of a second comparative example. FIG. 22 is an essential-part cross-sectional view of the semiconductor device of the second comparative example. FIGS. 23 and 24 are essential-part cross-sectional views in the manufacturing process of the semiconductor device of the second comparative example.

As shown in FIG. 22, in the semiconductor device of the second comparative example, the MOSFET 13 as a p-channel type vertical MOSFET is formed by the p⁻ type drift layer 2, the n type body layer 4, the p⁺ type source layer 5, the gate insulating film GI1, and the gate electrode GE1. Further, the MOSFET 13 has an n⁻ type semiconductor region 103 formed adjacent to the p⁻ type drift layer 2. Then, the super junction structure is formed by the p⁻ type drift layer 2 and the n⁻ type semiconductor region 103. In other words, similar to the embodiment, also the semiconductor device of the second comparative example is a semiconductor device including a p-channel trench gate vertical MOSFET.

On the other hand, the semiconductor device of the second comparative example is different from the semiconductor device of the embodiment in that the lower surface of the n⁻ type semiconductor region 103 is located above the upper surface of the p⁺ type drain layer 1, so that the n⁻ type semiconductor region 103 does not contact the p⁺ type drain layer 1. Then, a p⁻ type drift layer 102 is interposed between the lower surface of the n⁻ type semiconductor region 103 and the upper surface of the p⁺ type drain layer 1. This is because the manufacturing method of the semiconductor device of the second comparative example is different from the manufacturing method of the semiconductor device of the embodiment, which will be described below.

In the manufacturing process of the semiconductor device of the second comparative example, the semiconductor substrate SUB comprised of the p⁺ type drain layer 1 is prepared by performing the same process as Step S1 of the manufacturing process of the semiconductor device of the embodiment. Then, as shown in FIG. 23, a p type semiconductor film SCF100 is epitaxially grown over the p⁺ type drain layer 1. More specifically, the p type semiconductor layer SCF100 in which a p type impurity, such as, for example, boron (B) is introduced, is epitaxially grown over the p⁺ type drain layer 1, for example, by using the CVD method.

Next, n type impurity ions IM101, such as, for example, phosphorus (P) or arsenic (As), are introduced into the upper part of the p type semiconductor film SCF100, for example, by using the ion implantation method. At this time, the n type impurity is not ion implanted into the area SCF101 of the area of the p type semiconductor film SCF100 that is covered by the mask film MSK. On the other hand, the n type impurity ions Evan are implanted into the area ACF102 of the area of the p type semiconductor film SCF100, which is adjacent to the area SCF101 and is exposed from the mask film MSK. In this way, there is formed the p⁻ type drift layer 2 comprised of the area SCF101 in which the p type impurity is introduced and the n type impurity is not introduced. Then, there is formed the n⁻ type semiconductor region 103 comprised of the area SCF102 in which the n type impurity is introduced. Note that the following manufacturing process can be the same as Steps S4 to S11 of the manufacturing process of the semiconductor device of the embodiment.

In other words, in the semiconductor device of the second comparative example, the p⁻ type drift layer 2 and the n⁻ type semiconductor region 103 are formed in such a way that the n type impurity is not ion implanted into the area SCF101 of the p type semiconductor film SCF100, and that the p type impurity is ion implanted into the area SCF102 of the semiconductor film SCF100 that is adjacent of the area SCF101. The p type impurity is introduced into the p type semiconductor film SCF100. The p⁻ type drift layer 2 is comprised of the area SCF101 in which the p type impurity is introduced and the n type impurity is not introduced. Then, the n⁻ type semiconductor region 103 is comprised of the area SCF102 in which the n type impurity is introduced.

However, the region of the impurity ions IM101 when the n type impurity ions IM101, such as, for example, phosphorus (P) or arsenic (As) are implanted, namely, the depth from the point at which the impurity ions IM101 penetrate the n type semiconductor film SCF to the point at which the impurity ions IM101 stop penetrating, is shallower than the range of the impurity ions when the p type impurity ions, such as boron (B) are implanted. Thus, the lower surface of the n⁻ type semiconductor region 103 is located above the upper surface of the p⁺ type drain layer 1, and the n⁻ type semiconductor region 103 does not contact the p⁺ type drain layer 1. Then, the p⁻ type drift layer 102 comprised of the area SCF102, in which the n type impurity is not introduced, is interposed between the lower surface of the n⁻ type semiconductor region 103 and the upper surface of the p⁺ type drain layer 1. Note that the p⁻ type drift layer 2 is comprised of the area SCF101 in which the n type impurity is not introduced, so that the lower surface of the p⁻ type drift layer 2 is located at the same height as the upper surface of the p⁺ type drain layer 1, and the p⁻ type drift layer 2 is brought into contact with the p⁺ type drain layer 1.

Thus, it is difficult to form the super junction structure comprised of the interface between the p⁻ type drift layer 2 and the n⁻ type semiconductor region 103 so as to reach the lower surface from the upper surface of the semiconductor SCF100. In other words, the super junction structure may not be formed in the lower part of the semiconductor film SCF100, so that the area of the interface between the p⁻ type drift layer 2 and the n⁻ type semiconductor region 103 may not be increased.

In such a semiconductor device of the second comparative example, it is difficult to sufficiently reduce the ON resistance while keeping the breakdown voltage constant in the p-channel type vertical MOSFET. As a result, the performance of the semiconductor device is reduced. In other words, since it is not easy to form the super junction structure in a p-channel trench gate vertical MOSFET, the ON resistance may not be sufficiently reduced while keeping the breakdown voltage constant. As a result, the performance of the semiconductor device is reduced.

<Description of the Number of Steps of the Process for Performing Epitaxial Growth>

Figure 25:
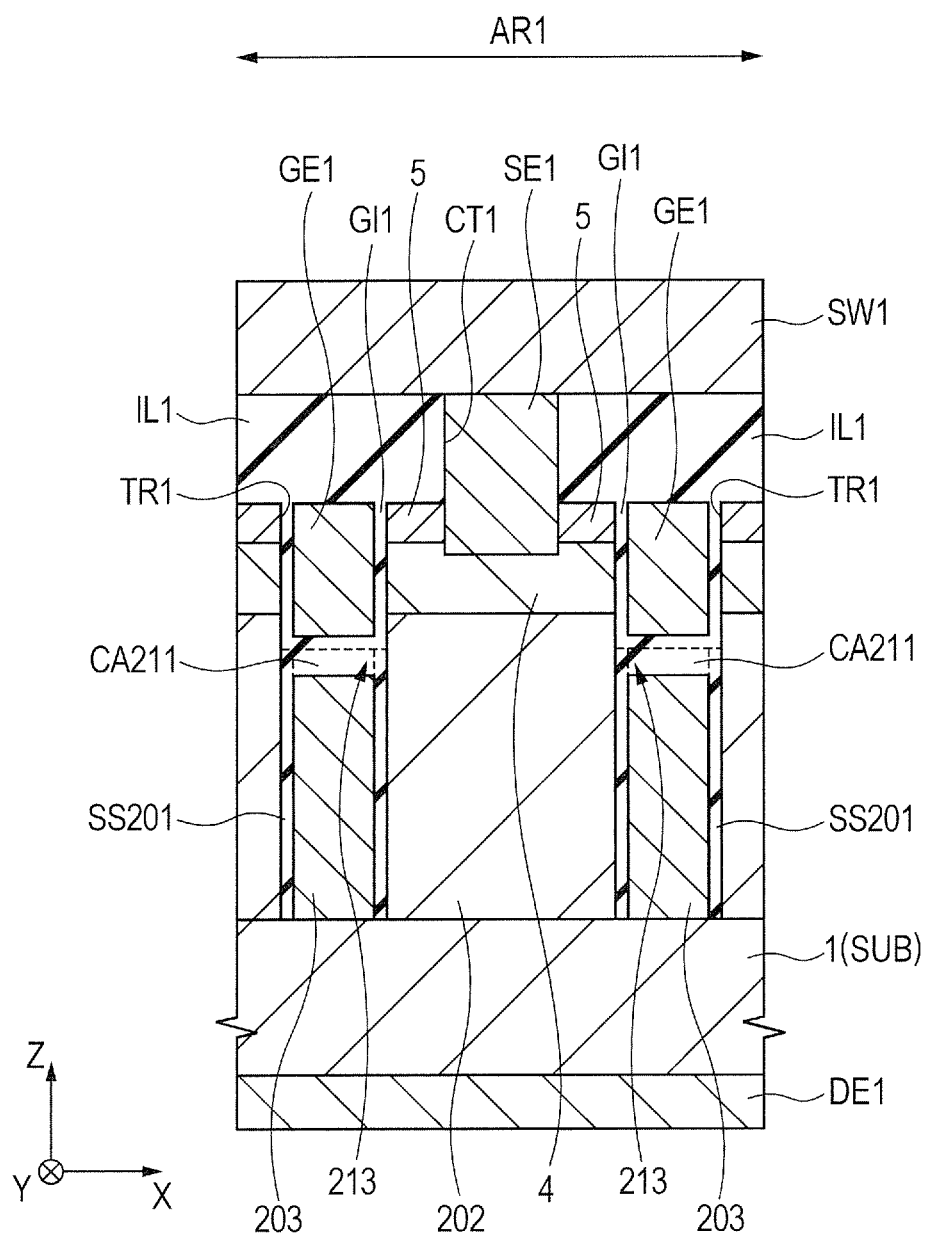
FIG. 25 is an essential-part cross-sectional view of a semiconductor device according to a third comparative example.
Figure 26:
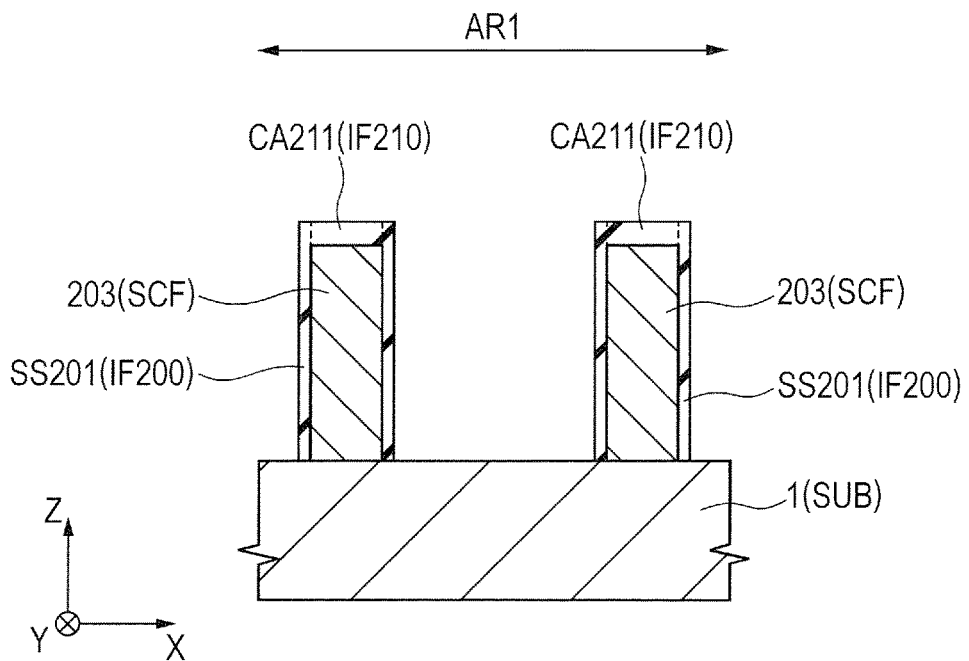
FIG. 26 is an essential-part cross-sectional view in the manufacturing process of the semiconductor device according to the third comparative example.
Figure 27:
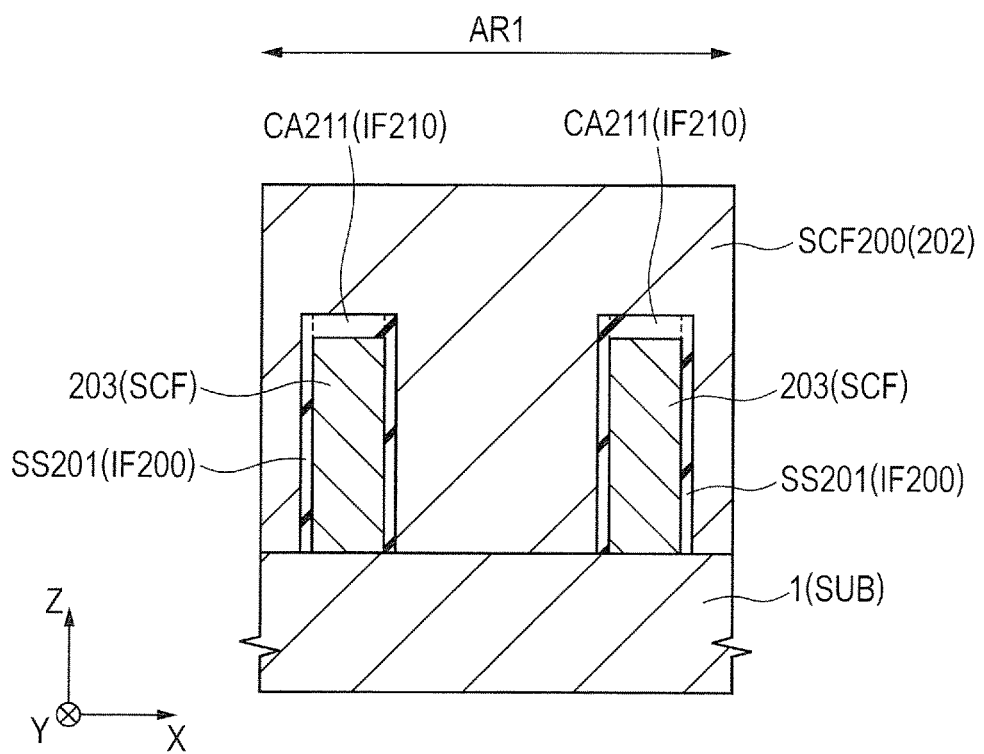
FIG. 27 is an essential-part cross-sectional view in the manufacturing process of the semiconductor device according to the third comparative example.

Next, the number of steps of the process of performing epitaxial growth will be described by comparing with the manufacturing method of a semiconductor device of a third comparative example. FIG. 25 is an essential-part cross-sectional view of the semiconductor device of the third comparative example. FIGS. 26 and 27 are essential-part cross-sectional views in the manufacturing process of the semiconductor device of the third comparative example.

As shown in FIG. 25, a MOSFET 213 as a p-channel type vertical MOSFET is formed by a p⁻ type drift layer 202, the n-type body layer 4, the p⁺ type source layer 5, the gate insulating film GI1, and the gate electrode GE1. Further, the MOSFET 213 has an n⁻ type semiconductor region 203 adjacent to the p⁻ type drift layer 202 through a side wall SS201, in which the super junction structure is formed by the p⁻ type drift layer 202 and the n⁻ type semiconductor region 203. In other words, similar to the embodiment, also the semiconductor device of the third comparative example is a semiconductor device including a p-channel trench gate vertical MOSFET having the supper junction structure.

In the manufacturing process of the semiconductor device of the third comparative example, the n type semiconductor film SCF is epitaxially grown by performing the same process as Steps S1 and S2 of the manufacturing process of the semiconductor device of the embodiment. After that, as shown in FIG. 26, an insulating film IF210 comprised of a silicon oxide film is formed over the n type semiconductor film SCF. Next, as shown in FIG. 26, the n⁻ type semiconductor region 203 comprised of the n type semiconductor film SCF having a columnar shape, as well as a cap CA211 comprised of the insulating film IF210 over the n⁻ type semiconductor region 203 are formed by using the photolithography technique and by the etching technique.

Next, an insulating film IF200 is formed so as to cover the n⁻ type semiconductor region 203 and the cap CA211, over the semiconductor substrate SUB comprised of the p⁺ type drain layer 1. Then, as shown in FIG. 26, a side wall SS201 comprised of the part of the insulating film IF200 that is formed over the side surface of the n⁻ type semiconductor region 203, by anisotropic etching. At this time, the upper surface of the part of the p⁺ type drain layer 1 that is located between the adjacent two n⁻ type semiconductor regions 203 is exposed.

Next, as shown in FIG. 27, the p type semiconductor film SCF200 is epitaxially grown so as to cover the n⁻ type semiconductor region 203, the side wall SS201, and the cap CA211 over the p⁺ type drain layer 1. The p type semiconductor film SCF200 is a semiconductor film that is to be the p⁻ type drift layer 202 in the following steps. In this way, the structure similar to the structure described with reference to FIG. 11 can be obtained. Note that the following manufacturing process can be the same as the manufacturing process of the semiconductor device of the embodiment.

As described above, in the manufacturing process of the semiconductor device of the third comparative example, the number of steps for performing epitaxially growth of the semiconductor is two. Thus, the number of steps in the manufacturing process of the semiconductor device increases. As a result, the manufacturing cost may increase.

Further, in the manufacturing process of the semiconductor device of the third comparative example, it is necessary to perform the steps of forming the insulating film IF200 and performing anisotropic etching, in order to form the p⁻ type drift layer 202 and the n⁻ type semiconductor region 203. This increase in the number of steps in the manufacturing process of the semiconductor device may lead to an increase in the manufacturing cost. Further, in the third comparative example, a defect is likely to be generated in the side wall SS201 that is comprised of the insulating film IF200, allowing a leakage current to easily flow across the side wall SS201 through the generated defect. As a result, the breakdown voltage may be reduced.

<Major Features and Effects of the Present Embodiment>

Meanwhile, in the semiconductor device of the present embodiment, the p⁻ type drift layer 2 and the n⁻ type semiconductor region 3 are formed in such a way that the p type impurity is ion implanted into the area SCF1 of the n type semiconductor film SCF that is epitaxially grown over the p type semiconductor substrate SUB, and that the p type impurity is not ion implanted into the area SCF2 adjacent to the area SCF1. The p⁻ type drift layer 2 is comprised of the area SCF1 in which the p type impurity is introduced. Then, the n⁻ type semiconductor region 3 is comprised of the area SCF2 in which the p type impurity is not introduced.

In other words, in the manufacturing method of the semiconductor device according to the present embodiment, the p type impurity is ion implanted into the area SCF1 of the n type semiconductor film SCF that is epitaxially grown over the p type semiconductor substrate SUB, and the p type impurity is not ion implanted into the area SCF2, which is the area of the n type semiconductor film SCF and is adjacent to the area SCF1. In this way, the p⁻ type drift layer 2 comprised of the area SCF1 in which the p type impurity is introduced, as well as the n⁻ type semiconductor region 3 comprised of the area SCF2 in which the p type impurity is not introduced are formed.

The range of the impurity ions IM1 when the p type impurity ions IM1, such as, for example, boron (B) are implanted, namely, the depth from the point at which the impurity ions IM1 penetrate the n type semiconductor film SCF to the point at which the impurity ions IM1 stop penetrating, is deeper than the range of the impurity ions IM101 when the n type impurity ions IM101 (see FIG. 24), such as phosphorus (P) or arsenic (As) are implanted. Thus, the lower surface of the p⁻ type drift layer 2 is located at the same height as the upper surface of the p⁺ type drain layer 1. Then, the p⁻ type drift layer 2 is brought into contact with the p⁺ type drain layer 1. On the other hand, the n⁻ type semiconductor region 3 is comprised of the area SCF2 in which the p type impurity is not introduced, so that the lower surface of the n⁻ type semiconductor region 3 is located at the same height as the upper surface of the p⁺ type drain layer 1. Then, the n⁻ type semiconductor region 3 is brought into contact with the p⁺ type drain layer 1.

Thus, it is possible to easily form the super junction structure comprised of the interface between the p⁻ type drift layer 2 and the n⁻ type semiconductor region 3 so as to reach the lower surface from upper surface of the semiconductor film SCF. In other words, it is possible to form the super junction structure also in the lower part of the semiconductor film SCF, namely, also in the part contacting the p⁺ type drain layer 1 of the semiconductor film. SCF. As a result, it is possible to increase the area of the interface between the p⁻ type drift layer 2 and the n⁻ type semiconductor region 3.

As compared to the semiconductor device of the second comparative example, in the semiconductor device of the present embodiment having such a super junction structure, it is possible to sufficiently reduce the ON resistance while keeping the breakdown voltage constant in the p-channel type vertical MOSFET, and to improve the performance of the semiconductor device. For example, the use of the semiconductor device of the present embodiment as the inverter high-side MOSFET can simplify the control circuit of the inverter and can reduce the ON resistance of the p-channel MOSFET, as compared to the use of the semiconductor device of the second comparative example.

Further, in the manufacturing process of the semiconductor device of the present embodiment, the number of steps for performing the epitaxial growth of the semiconductor film is one. Thus, as compared to the manufacturing process of the semiconductor device of the third comparative example, in the manufacturing process of the semiconductor device of the present embodiment, it is possible to reduce the number of steps in the manufacturing process of the semiconductor device, and to reduce the manufacturing cost.

In addition, in the manufacturing process of the semiconductor device of the present embodiment, it may not be necessary to perform the steps of forming the insulating film IF200 (see FIG. 26) and performing anisotropic etching in order to form the p⁻ type drift layer 2 and the n⁻ type semiconductor region 3. In this point also, in the manufacturing process of the present embodiment, it is possible to reduce the number of steps and to reduce the manufacturing cost as compared to the manufacturing process of the semiconductor device of the third comparative example. Further, in the present embodiment, the reduction of the breakdown voltage due to the defect generated in the side wall SS201 (see FIG. 26) can be prevented or reduced as compared to the third comparative example.

When the n type semiconductor film SCF is epitaxially grown over the p⁺ type drain layer 1, the p type impurity comprised of, such as, for example, boron within the p⁺ type drain layer 1 is likely to be diffused into the n type semiconductor film SCF in the heat treatment or the like after the epitaxial growth, as compared to the case of the epitaxially growth of the p type semiconductor film SCF100 (see FIG. 24). For this reason, when the n type semiconductor film SCF is formed over the p⁺ type drain layer 1 by epitaxial growth, the process conditions after epitaxial growth, such as those of the heat treatment, are greatly restricted in order to prevent or reduce the p type impurity from being diffused into the n type semiconductor film SCF form the p⁺ type drain layer 1. Thus, in terms of the fact that the process conditions are greatly restricted, it has been difficult to form the n type semiconductor film SCF over the p⁺ type drain layer 1 by epitaxial growth so that the p⁺ type drain layer 1 is used as a portion of the MOSFET with the formed n type semiconductor film SCF left over.

On the other hand, in the present embodiment, the p⁻ type drift layer 2 comprised of the area SCF1 in which the p type impurity is introduced is formed by introducing the p type impurity into the area SCF1 which is the essential part of the n type semiconductor film SCF. Thus, the area SCF1, which is the essential part of the n type semiconductor film SCF, is not left as the n type semiconductor film SCF.

Further, in the present embodiment, there is formed the n⁻ type semiconductor region 3 comprised of the left area SCF2 of the n type semiconductor film SCF. However, even if a small amount of the p type impurity is diffused into the n⁻ type semiconductor region 3 from the p⁺ type drain layer 1, the influence on the super junction structure formed in the interface between the p⁻ type drift layer 2 and the n⁻ type semiconductor region 3 is not significant.

In other words, the present inventors have found for the first time that a good super junction structure can be formed by taking advantage of the epitaxial growth of the n type semiconductor film SCF over the p⁺ type drain layer 1, which has been difficult to achieve in the past, in such a way that the n⁻ type semiconductor region 3 is formed while leaving the area SCF2 which is the part other than the essential part of the n type semiconductor film SCF.

Note that in the manufacturing process of the semiconductor device of the third comparative example, as described with reference to FIG. 27, the p type impurity may be diffused into the n type semiconductor film SCF from the p⁺ type drain layer 1 when the p type semiconductor film SCF200, which is to be the p⁻ type drift layer 202, is epitaxially grown in the following steps. For this reason, the process conditions for the epitaxial growth of the p type semiconductor film SCF200 are greatly restricted. As a result, it is difficult to epitaxially grow a high quality p type semiconductor film SCF200.

The invention made by the present inventors has been concretely described based on the embodiment. However, it goes without saying that the present invention is not limited to the above embodiment and various modifications and alterations can be made within the scope of the present invention.

What is claimed is:

1. A semiconductor device comprising:
a p type semiconductor substrate;
a p type first semiconductor region formed over the semiconductor substrate;
an n type second semiconductor region formed adjacent to the first semiconductor region over the semiconductor substrate;
an n type third semiconductor region formed over the first semiconductor region and over the second semiconductor region;
a p type fourth semiconductor region formed over the third semiconductor region;
a first groove penetrating through a top surface of the first semiconductor region, after passing through the fourth semiconductor region and through the third semiconductor region;
a gate insulating film formed in an inner wall of the first groove;
a gate electrode formed over the first gate insulating film so as to fill the first groove;
a source electrode contacting the third semiconductor region and the fourth semiconductor region; and
a drain electrode electrically coupled to the semiconductor substrate;
wherein a transistor is formed by the first semiconductor region, the third semiconductor region, the fourth semiconductor region, the gate insulating film, and the gate electrode,
wherein the first semiconductor region and the second semiconductor region are formed by implanting ions of a p type first impurity into a first area of an n type semiconductor film that is epitaxially grown over the semiconductor substrate, and by not implanting ions of the first impurity into a second area of the semiconductor film, the second area being adjacent to the first area,
wherein the first semiconductor region is comprised of the first area in which the first impurity is introduced, and
wherein the second semiconductor region is comprised of the second area in which the first impurity is not introduced.

2. The semiconductor device according to claim 1,
wherein the first semiconductor region is brought into contact with the semiconductor substrate.

3. The semiconductor device according to claim 1,
wherein an n type second impurity is introduced into the semiconductor film,
wherein the second semiconductor region is comprised of the second area in which the second impurity is introduced and the first impurity is not introduced,
wherein an n type third impurity is introduced into the third semiconductor region, and
wherein the concentration of the third impurity in the third semiconductor region is higher than the concentration of the second impurity in the second semiconductor region.

4. The semiconductor device according to claim 1,
wherein an inverter is formed by the transistor.

* * * * *